United States Patent [19]
Karnowski et al.

[11] 4,093,850
[45] June 6, 1978

[54] RATEMETER WHICH CALCULATES THE RECIPROCAL OF THE PERIOD

[75] Inventors: Thomas A. Karnowski, Milwaukee; Michael W. Shawaluk, Watertown, both of Wis.

[73] Assignee: Cutler-Hammer, Inc., Milwaukee, Wis.

[21] Appl. No.: 771,169

[22] Filed: Feb. 22, 1977

[51] Int. Cl.$^2$ .......................................... G01R 23/02
[52] U.S. Cl. ........................... 235/92 TF; 235/92 FQ; 235/92 DM; 235/92 R; 235/92 CP; 364/701; 364/766
[58] Field of Search ............ 235/92 FQ, 92 T, 92 TF, 235/92 DM, 92 CP, 152, 196

[56] References Cited
U.S. PATENT DOCUMENTS

| | | | |
|---|---|---|---|
| 3,578,960 | 5/1971 | Georgi et al. | 235/92 T |
| 3,705,296 | 12/1972 | Kochi | 235/92 TF |
| 3,859,512 | 1/1975 | Ritzinger | 235/92 TF |
| 3,922,670 | 11/1975 | Shaw et al. | 235/92 TF |
| 4,027,146 | 5/1977 | Gilmore | 235/92 FQ |
| 4,031,373 | 6/1977 | Beckwith | 235/92 T |

OTHER PUBLICATIONS

Matthew L. Fichtenbaum, Counter Inverts Period to Measure Low Frequency, "Electronics", Mar. 4, 1976, pp. 100-101.

*Primary Examiner*—Joseph M. Thesz
*Attorney, Agent, or Firm*—Hugh R. Rather; William A. Autio; Michael E. Taken

[57] ABSTRACT

A fast response digital ratemeter is disclosed which calculates the reciprocal of every period between consecutive event pulses. A period counter is continuously incremented by clock pulses of a known frequency and measures the interval between event pulses by accumulating the clock pulses. Each event pulse both marks the end of the previous period and the beginning of the new period by latching the accumulated incremented counts of the period counter into a memory and resetting the period counter to immediately begin re-accumulating clock pulses occurring in the new period. The memory applies the accumulated counts as a divisor to divider means which divides the divisor into a known constant by repetitively subtracting the divisor from the constant. Since the divisor is retained by the memory, incrementation to the value of the divisor is necessary only once (during measurement of the period by the period counter), not before each subtraction, thus minimizing calculation time. Display counter means count the number of subtractions performed and display this as the rate of recurrence of input events in units determined by the constant. Decimal point shifting (including underflow and overflow detection), period averaging, overrun detection, and synchronization of event and clock pulses are also disclosed.

35 Claims, 10 Drawing Figures

RATEMETER WHICH CALCULATES THE RECIPROCAL OF THE PERIOD

BACKGROUND OF THE INVENTION

This invention relates to digital ratemeters indicating rate as the reciprocal of the period.

Ratemeters which measure an interval between first and second event pulses and then perform a division calculation between second and third event pulses are known. These ratemeters suffer the disadvantage of only being able to measure every other period because the remaining alternate intervals are required to perform the calculation, i.e. every other period is skipped to allow performance of the division. Response time is slow and the number of significant digits in the displayed rate is limited. Applications require moderate speed of input events because resolution is not maintained at low rates.

Other ratemeters are known which count clock pulses and event pulses over a predetermined fixed interval, and calculate the quotient thereof. These types do not provide rapid response when the rate of event inputs is slow without producing a large inaccuracy. Applications require even greater speed of input events than the above ratemeters to maintain resolution.

While these prior ratemeters have been useful for their intended purposes, the present invention relates to improvements thereover.

SUMMARY OF THE INVENTION

The present invention relates to an improved ratemeter for determining the repetition rate of recurring events by measuring the elapsed time between events and dividing this elapsed time into a predetermined constant to provide a rate indication in the units desired.

Each and every period between consecutive event pulses is measured and a rate indicated therefor. Measurement of the present period and rate calculation of the previous period are performed concurrently whereby an off cycle to enable a rate calculation is not required after an on cycle in which the period is measured.

The elapsed time is represented by the number of clock pulses of known frequency accumulated by a period counter in the interval between consecutive event pulses. Division is performed by repetitively subtracting this number of accumulated clock pulses from the known constant. Fast response is enabled by memory means which retain the number of accumulated clock pulses to permit each subtraction to be performed without re-incrementing to such number prior to each subtraction, thus reducing calculation time.

This fast response time enables a greater number of significant digits in the displayed rate while still maintaining resolution. Furthermore, resolution is maintained even for slow rates of input events.

It is therefor an object of the present invention to provide an improved ratemeter exhibiting fast response, maintaining resolution even at slow repetition rates of recurring input events, and affording a greater number of significant digits in the displayed rate.

Another object is to provide a ratemeter which enables a rate calculation to be performed for every period between consecutive event pulses.

Another object is to provide a ratemeter of the aforementioned character which alleviates time-consuming re-incrementation to the value of the divisor before each subtraction in a division calculation.

Another object is to provide a floating decimal point system including overflow and underflow detection means for causing a decimal point shift in the displayed rate to maximize the number of significant digits displayed.

Another object is to provide a period averaging means to enable meaningful and usable results when, for example, events are sporadically spaced in time and instantaneous rates are inconsequential.

Another object is to provide overrun detection means for detecting and indicating when an event pulse occurs while a division calculation is in progress.

Another object is to provide means for synchronizing each event pulse to a clock pulse.

Other objects and advantages as well as further explanation of the above objects will appear hereinafter.

DESCRIPTION OF THE PREFERRED EMBODIMENT

Figure 1:
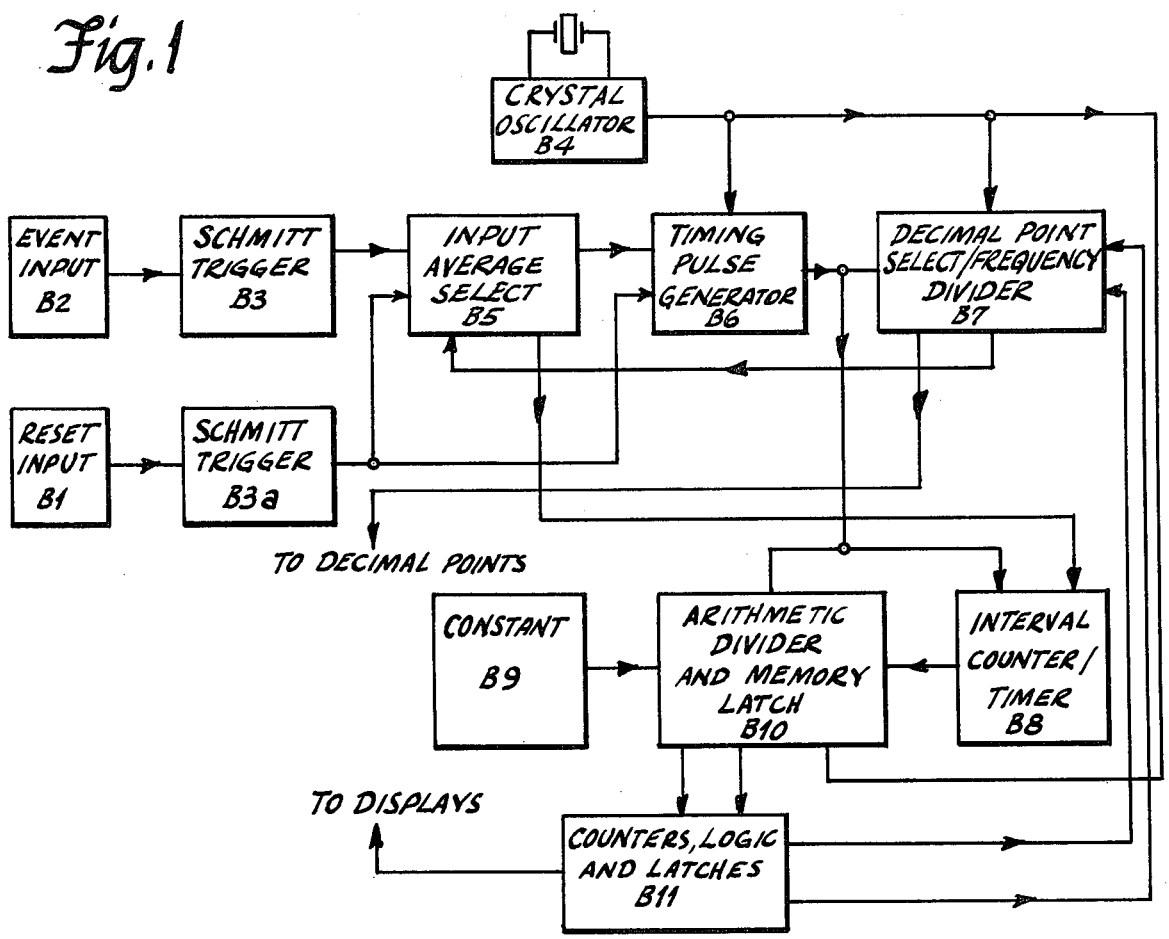
FIG. 1 is a block diagram schematically illustrating the preferred embodiment of the present invention.

FIG. 1 illustrates the ratemeter in terms of schematic blocks, rather than specific components, to enable a functional understanding of interactions which occur to display a numeric rate indication. These blocks represent functions performed which, acting together, measure the period between events, reciprocate this period, and display a true indication of rate.

Block B1 represents a reset input which serves to initialize conditions within the modules and occurs when power is initially applied or is user applied.

Block B2 represents an event input and is used to enter the event into the unit.

Blocks B3 and B3a represent means for providing noise immunity and signal conditioning such as Schmitt triggers or the like, to insure that both the event and reset inputs are digitally clean signals free from external noise.

Block B4 provides a very accurate timing source in the form of a constant frequency, such as a crystal oscillator, which is utilized by the other blocks in the unit.

Block B5 enables the unit to perform a rate calculation for every time interval entered or to accumulate N consecutive time intervals. The number N is a programmable feature which enables the unit to display a rate that is averaged over N time intervals. This is accomplished by affecting both the base oscillator frequency from B4 and the number of intervals to be accumulated. As an example, if the rate is to be averaged over ten successive event input signals, the input averaging circuit in B5 would be set to accept only every tenth event input and the oscillator frequency would be divided by ten. For one hundred period averaging, every hundredth period is accepted and the frequency is reduced by a factor of one hundred. If the number of periods to be averaged is the same as the number the frequency is being divided by, then the calculated rate will be the true average of the individual rates; if the two numbers are different, then the rate will be scaled by the ratio of these two numbers.

Block B6 provides synchronization of incoming event signals to the crystal oscillator signal by generating one fixed duration pulse for each input event (or series of accumulated events if averaging is being performed). This pulse performs reset, preset, and clocking operations in the other circuit blocks, as will be described hereinafter, and is held to the same duration by synchronizing the input signals to the phase of the oscillator signal.

Block B7 represents the combination of a bi-directional counter and a variable frequency divider which provides a floating decimal point position circuit. The state of the bidirectional counter is initialized at power turn-on or reset and determines both the position of the decimal point and the extent of frequency division to be performed corresponding to a decimal point shift. Logic in B7 provides for automatic shifting of the decimal point position at the conclusion of any calculation whose resultant rate is either too large to be displayed or too small to permit the maximum number of significant figures to be displayed. This is accomplished by dividing the incoming oscillator frequency (which may be further divided if scaling or period averaging is used) by a factor of ten for each place that the decimal point is shifted to the left. By dividing this frequency by ten, the input event time interval being measured is effectively divided by ten. This will result in a calculated rate that is a factor of ten larger than the "true" rate, since the time interval is the denominator of the equation used to calculate rate, as described in conjuncion with block B10 and elsewhere hereinafter. By shifting the decimal point to the left, the rate is effectively scaled to the correct magnitude with additional displayed accuracy.

Block B8 represents a counter which is incremented at the rate of the output frequency of B7. Thus the numeric value of this counter directly measures the time interval between successive (or averaged) events.

Block B9 represents a number which determines the units of measure which will be displayed, such as pulses per second, meters per minute, liters per hour, etc.

Block B10 performs an arithmetic division of two numbers, the numerator being the constant or number of B9 and the denominator being the time interval measured in B8. At the beginning of a division operation, the numerator and denominator are both latched into a divider in B10, thus enabling the interval timer of B8 to immediately begin timing another interval for the next calculation. The division is then accomplished by repetitively subtracting the value of the time interval from the constant's value until the result is less than or equal to zero at which time the division is completed. Each subtraction sends a count signal to block B11 which accumulates these pulses to represent the rate value.

Block B11 accumulates the pulses outputted by B10 and displays the number represented by these pulses. B11 also contains logic to sense whether or not the number is too large or too small to be displayed. Control lines run from B11 to B7 to accomplish these functions.

For a typical cycle, a rate input signal or event from B2 (or a fixed number of input event signals if input averaging of B5 is used) will cause the pulse generator in B6 to generate a timing pulse. This timing pulse will latch the constant (B9) and the present time interval (B8) into the divider B10, reset the timer B8, and allow the timer to begin a new interval. The divider will then reset the display counter of B11 and the calculation will take place controlled by the crystal oscillator of B4. At the end of the calculation, the display value will be updated to the new rate and any overflow or underflow information will be sent to B7. If this rate overflowed or underflowed the display, a decimal point shift will now occur. The unit is then ready for another rate calculation.

Figure 2A:
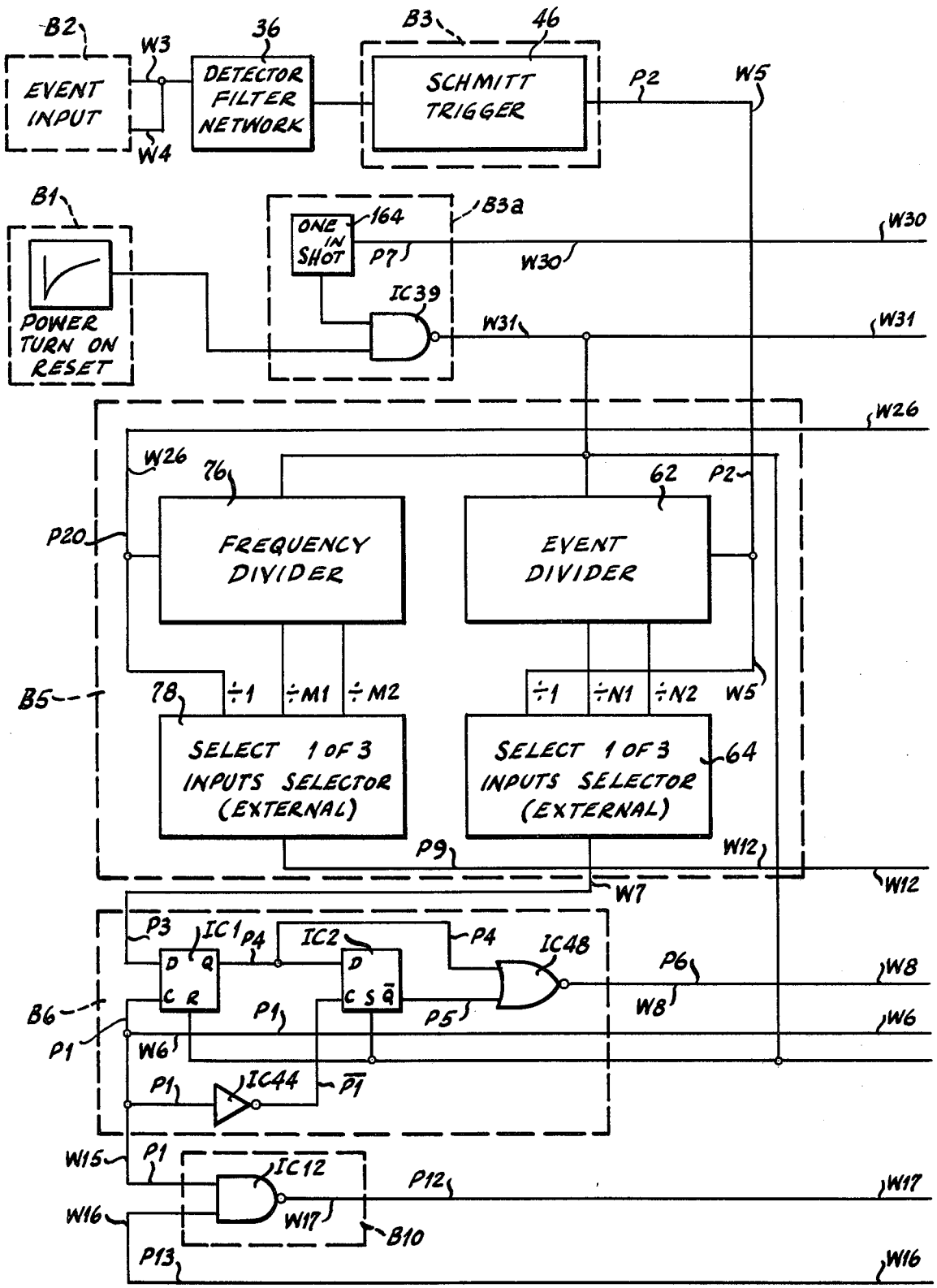
FIGS. 2a through 2c are a partial block and partial circuit diagram further illustrating the embodiment of FIG. 1.
Figure 2B:
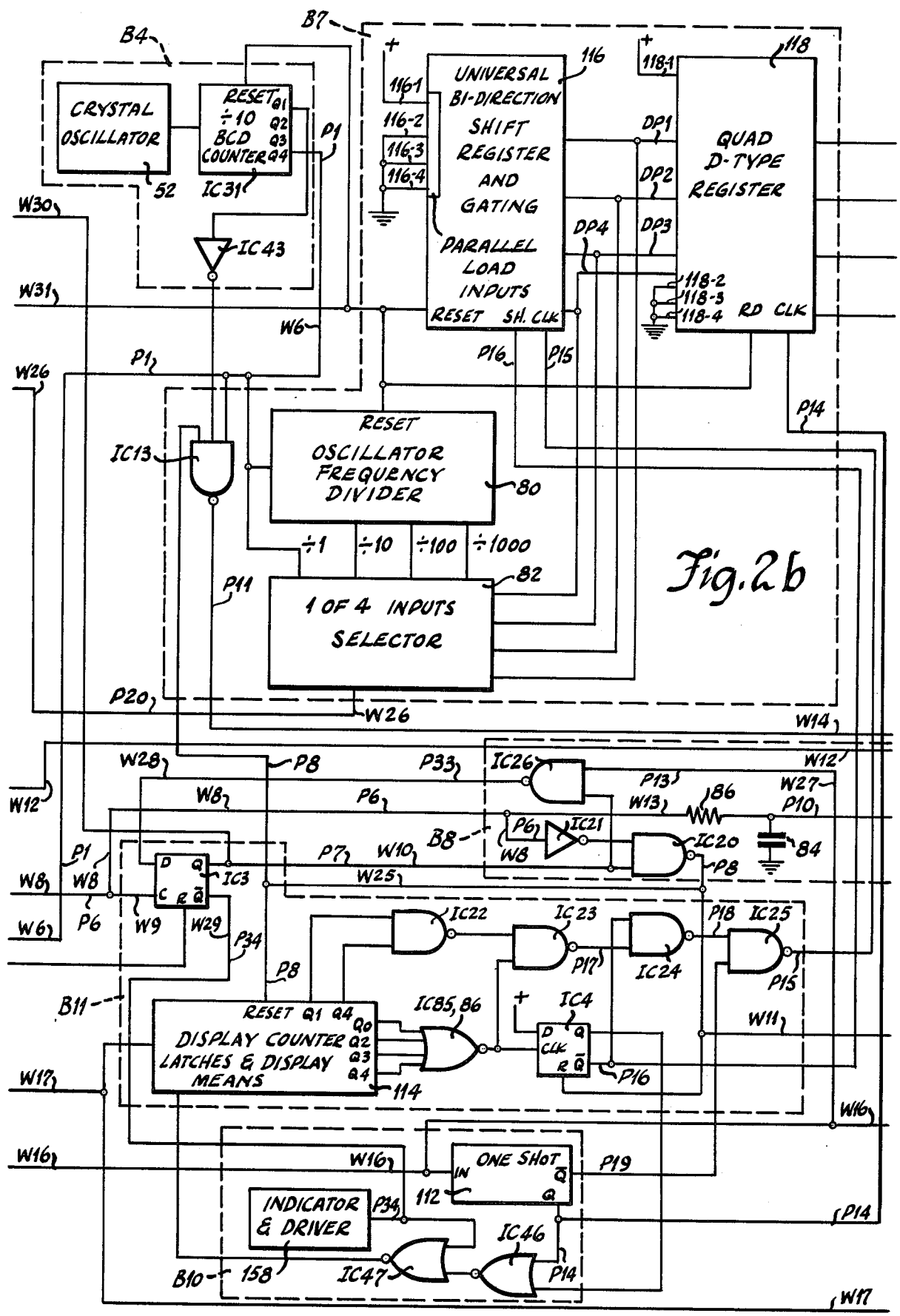
Figure 2C:
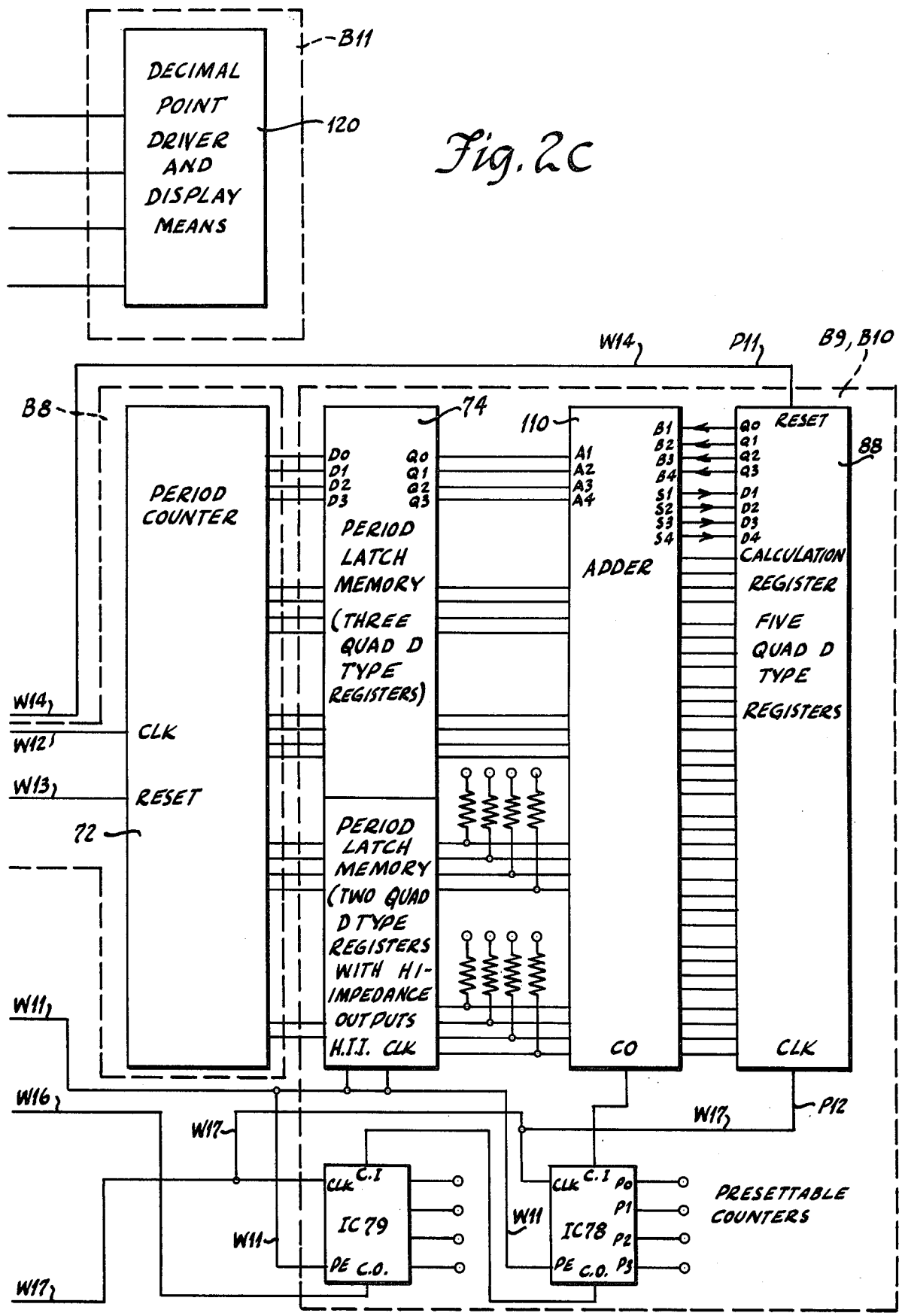

FIGS. 2a through 2c cumulatively show the device of FIG. 1 and disclose some of the components and their connections in the various blocks of FIG. 1. FIGS. 3a through 3e cumulatively show the device of FIG. 1 and disclose a complete circuit diagram thereof, adding further details and components omitted from FIGS. 2a through 2c. The blocks of FIG. 1 are shown in broken line in FIGS. 2a through 2c and 3a through 3e.

In the preferred embodiment of the device, CMOS (Complementary Metal Oxide Semiconductor) technology is utilized; other types are possible, for example TTL (transistor transistor logic). The following table cross-references the components in the drawings to their respective standard part numbers from which operating characteristics and other pertinent data may be obtained if desired.

| IC1 through IC8 | dual type D flip-flop | 4013 |
| IC10 through IC12 | triple 3-input nand gate | 4023 |
| IC13, IC14 | dual 4-input nand gate | 4012 |
| IC15 through IC26 | quad 2-input nand gate | 4011 |
| IC27 through IC38 | dual BCD up counter | 4518 |
| IC39 through IC44 | Hex gate | 4572 |
| IC45 through IC48 | quad 2-input nor gate | 4001 |
| IC49 through IC60 | hex buffer | 4049 |
| IC61 through IC64 | BCD to-seven segment latch/decoder/driver | 4511 |
| IC65 | quad data selector | 4519 |
| IC66 through I75 | quad D register | 4076 |
| IC76, IC77 | 12 bit binary counter | 4040 |
| IC78, IC79 | presettable binary up counter | 4516 |
| IC80 through IC84 | 4-bit full adder | 4008 |
| IC85, IC86 | dual 4-input nor gate | 4002 |

The drawings show the above mentioned parts (identified by part no.) separated into their constituent components in order to aid the following description and enhance the understanding of the disclosed embodiment. Many of the parts designated in the right column of the table actually combine a plurality of the components designated in the left column on a single chip. For example, part no. 4013 comprises two flip-flops on a single chip and thus only four 4013 parts are needed. The following is a list of those components which are shown separately but which are actually on the same chip as a single part: IC1 and IC2; IC3 and IC4; IC5 and IC6; IC7 and IC8; IC10 and IC11 and IC12; IC13 and IC14; IC15 and IC16 and IC17 and IC18; IC19 and IC20 and IC21 and IC26; IC22 and IC23 and IC24 and IC25; IC27 and IC28; IC29 and IC30; IC31 and IC32; IC33 and IC34; IC35 and IC36; IC37 and IC38; IC39 and IC40 and IC41 and IC42 and IC43 and IC44; IC45 and IC46 and IC47 and IC48; IC49 and IC50 and IC51 and IC52 and IC53 and IC60; IC54 and IC55 and IC56 and IC57 and IC58 and IC59; IC85 and IC86.

For consistency and clarity, the pin assignments used in the drawings correspond identically to the pin assignments given the respective part number.

Figure 3A:
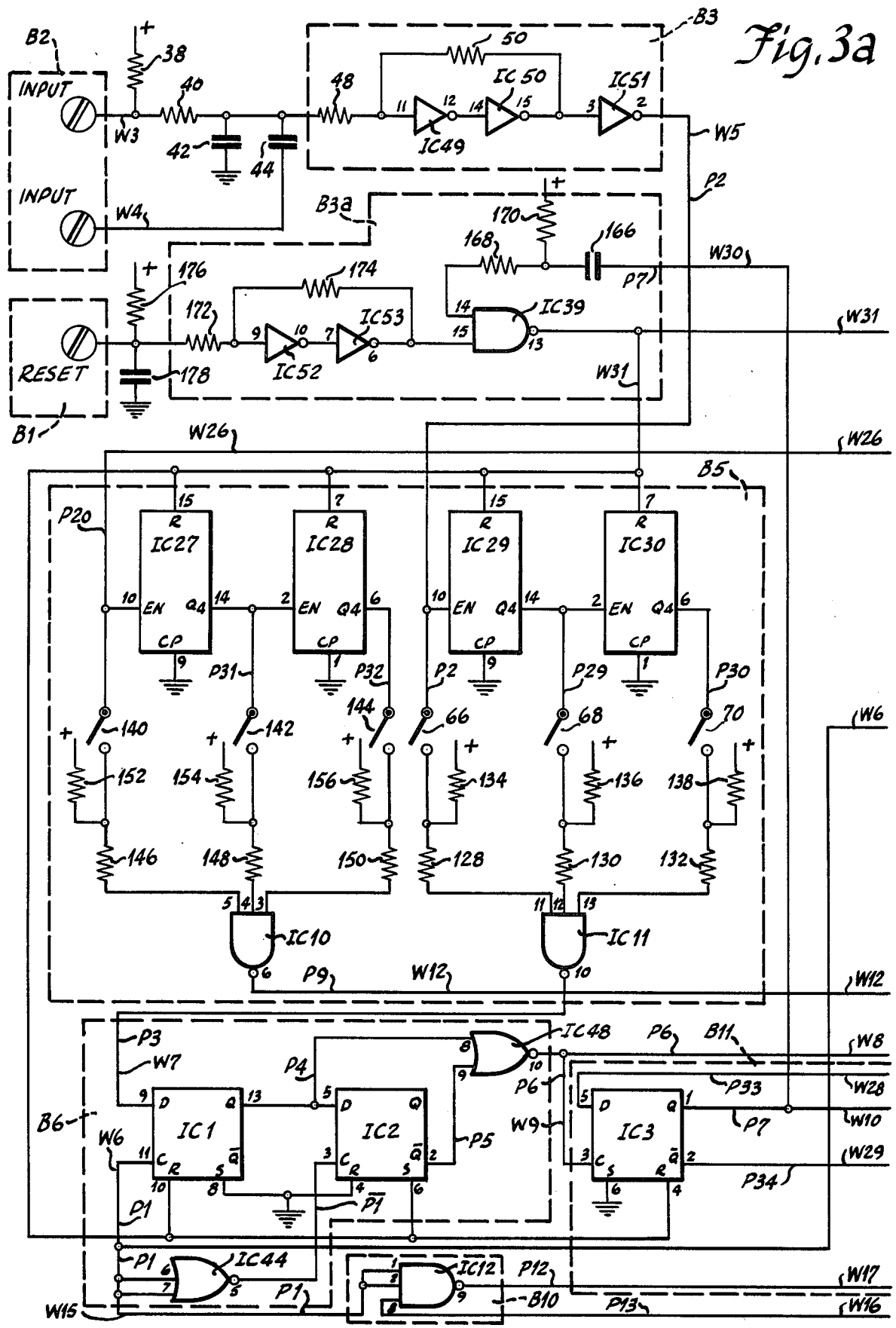
FIGS. 3a through 3e are a circuit diagram illustrating in further detail the embodiment of FIG. 1 and FIGS. 2a through 2c.
Figure 3B:
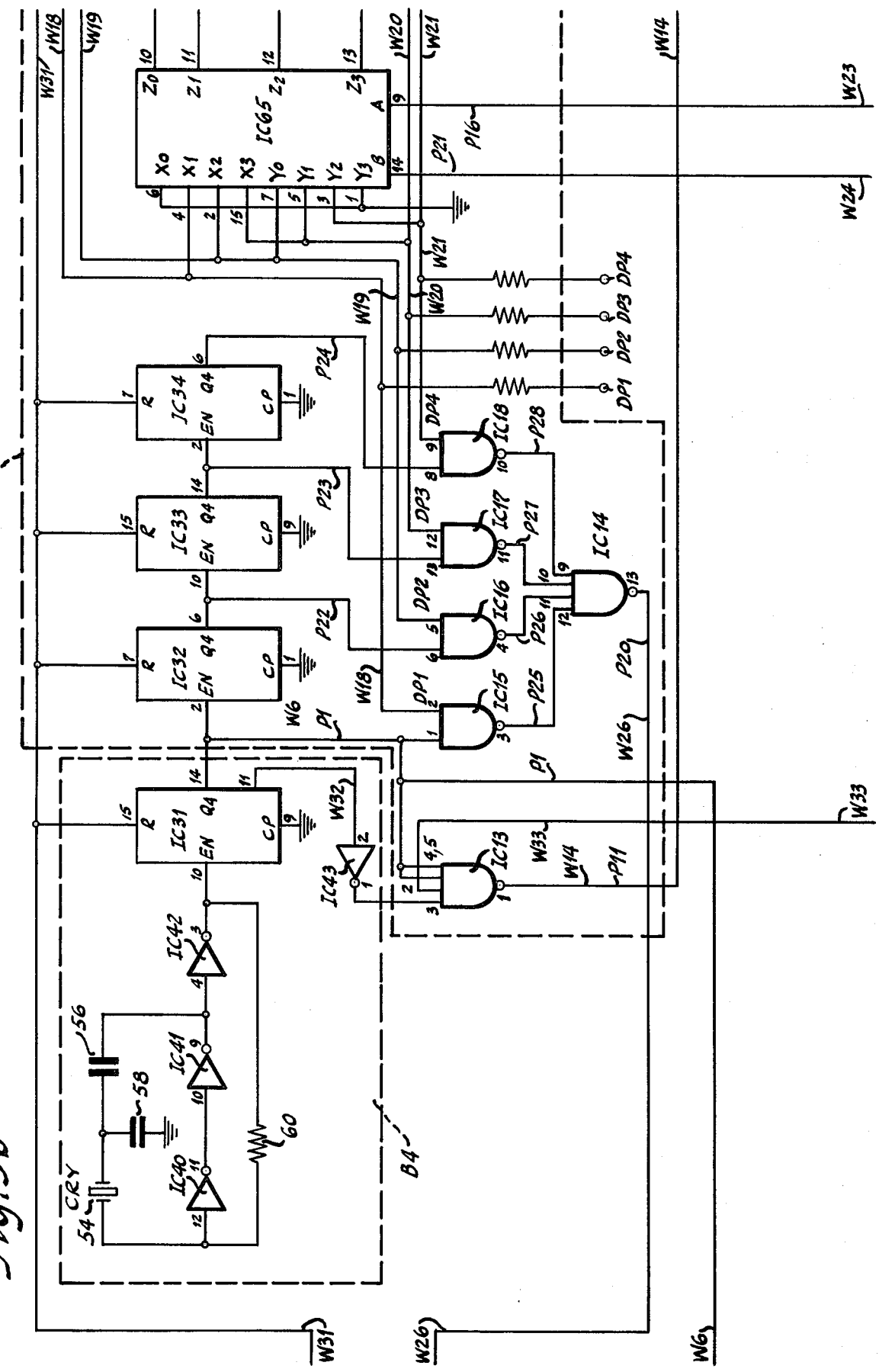
Figure 3C:
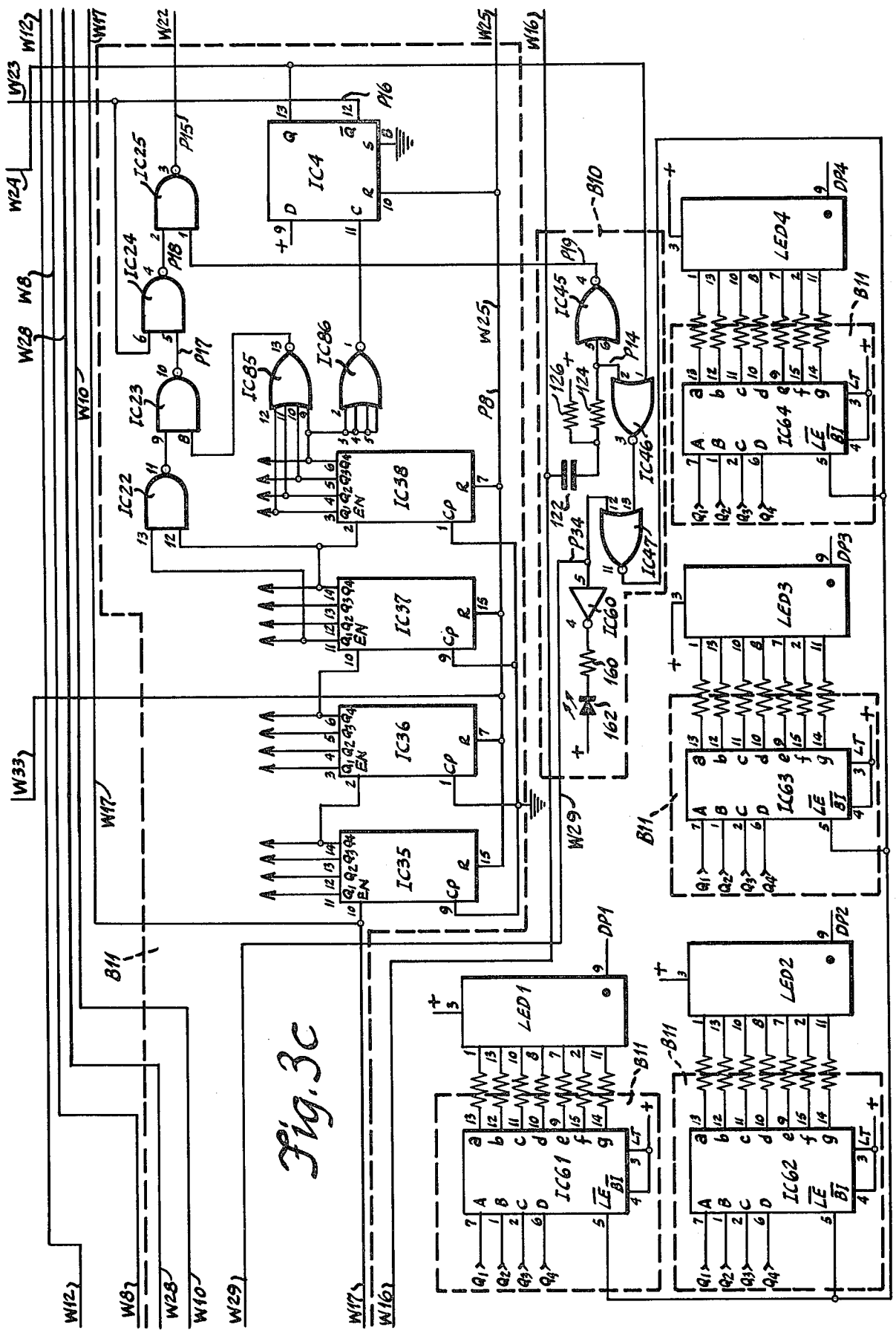
Figure 3D:
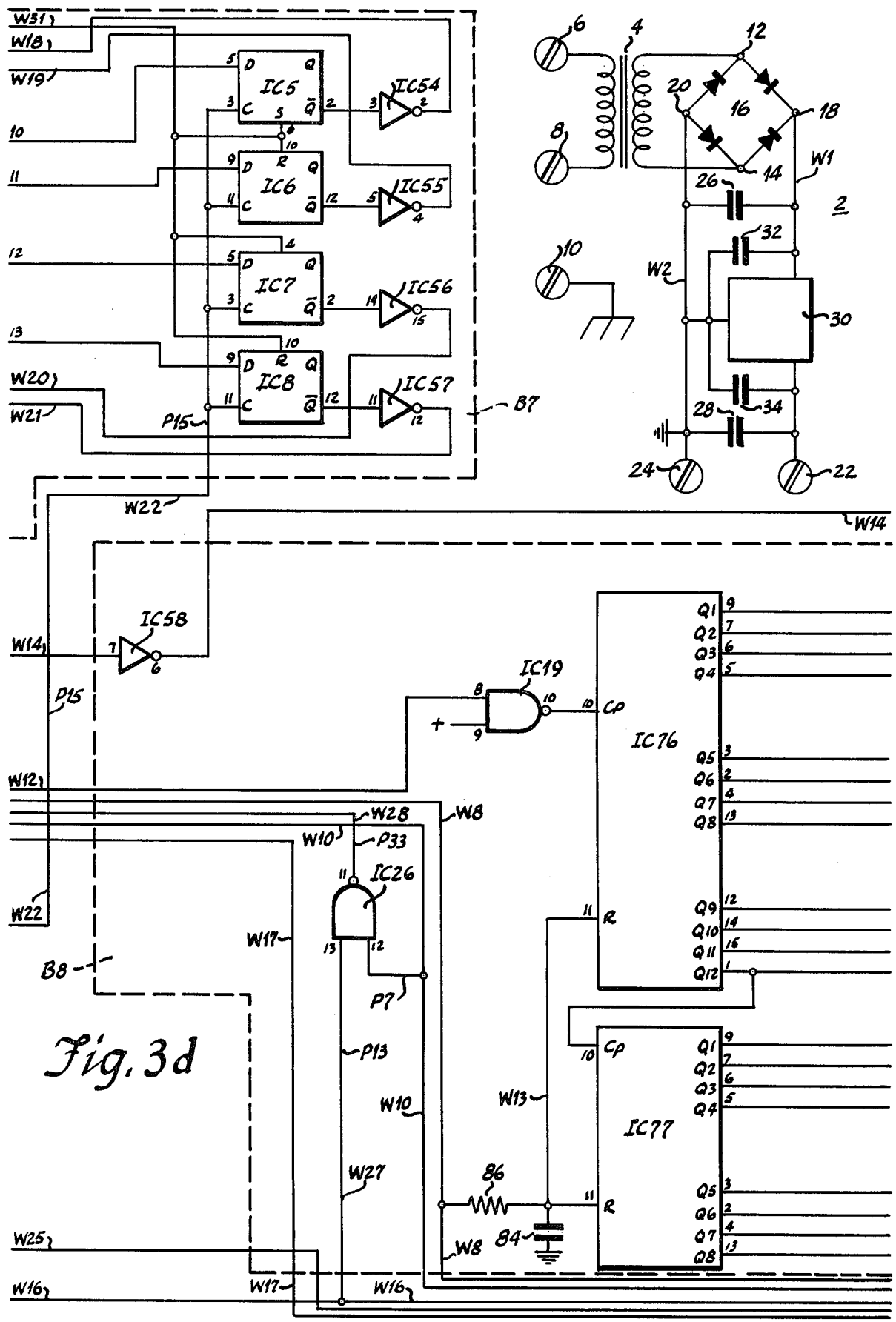

The ratemeter is provided with a power source 2, FIG. 3d, supplying 15 volts D.C. A transformer 4 steps down line voltage from terminals 6 and 8. Terminal 10 is grounded. The transformer is connected across the A.C. inputs 12 and 14 of a diode rectifier bridge 16 and the D.C. outputs 18 and 20 are connected to positive terminal 22 and common terminal 24. A 1,000 μf capacitor 26 is connected across wires W1 and W2 from the D.C. outputs. A 0.47 μf capacitor 28 is connected between W1 and W2 and grounded. Connected in series with W1 is a voltage regulator 30, for example a series No. 7800, part no. 7815, which is also connected to W2 as shown. A pair of 0.68 μf capacitors 32 and 34 are connected in parallel with 30 and also connected at their junction to 30 and W2 as shown. This power supply is known in the art and is not a limitation of the present invention.

Referring to FIGS. 2a and 3a, an event input signal is generated by applying a voltage change between input terminals connected to wires W3 and W4. This signal may be detected and filtered by conventional means 36, FIG. 2a, such as the depicted arrangement, FIG. 3a, of resistors 38, 40 and capacitors 42, 44. In this arrangement, a 3.3 K ohm resistor 38 is connected between W3 and the +15 volt D.C. source terminal 22, a 1 K ohm resistor is in series with W3, a 0.47 μf capacitor 44 is connected between W4 and W3, and a 0.001 μf capacitor 42 is connected between W3 and ground, as shown. This detecting and filtering means is beneficial for removing noise, but is not a constraint of the device.

Figure 4:
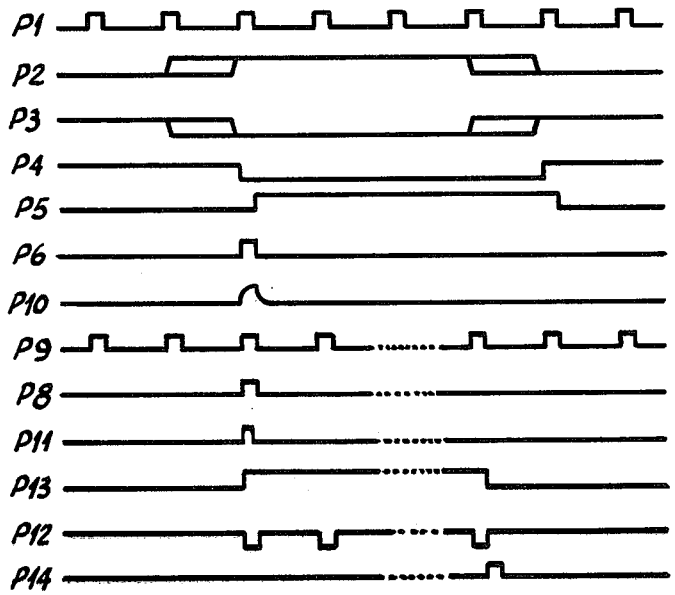
FIG. 4 is a timing diagram chronologically comparing various pulses in the circuit.

A Schmitt trigger 46, FIG. 2a, provides a clean squared up signal, pulse P2, FIG. 4, in wire W5, FIG. 2a. This Schmitt trigger comprises, FIG. 3a, a 33 K ohm resistor 48 in series with three serially connected inverting hex buffers IC49, IC50, IC51 providing low power dissipation and high noise immunity. A 150 K ohm resistor 50 is connected from the output of IC50 to the input of IC49.

As aforenoted, pin assignments for components in the drawings are the same as those for the corresponding part number in order to afford consistency between the present description and common usage in the art. Thus the designation IC49-11 shall mean pin 11 of component IC49. Referring to FIG. 3a, resistor 48 is connected between W3 and IC49-11; IC49-12 is connected to IC50-14; IC50-15 is connected to IC51-3; IC51-2 is connected to W5.

A master clock signal, pulse P1, FIG. 4, is generated in wire W6, FIG. 2b and 3b, by clock means such as a crystal oscillator 52, FIG. 2b. Referring to FIG. 3b, this crystal oscillator includes a one megahertz crystal 54 connected in series with a 10 pf capacitor 56 between IC40-12 and IC41-9. A 100 pf capacitor 58 is connected between ground and the junction of 54 and 56. IC40-11 is connected to IC41-10, IC41-9 is connected to IC42-4, and a 220 K ohm resistor 60 is connected between IC42-3 and IC40-12. IC40, IC41 and IC42 are inverting hex gates used for low power dissipation and high noise immunity. The output of IC42 is applied to BCD up counter IC31 at its enable input, pin IC31-10. The clock input of the counter, pin IC31-9 is grounded. Wire W6 is connected to the Q4-output of the counter, pin IC31-14, whereby a divide by ten operation is performed on the initial oscillator signal. The resulting master clock signal, pulse P1, in W6 is in a high state 20% of the time and is low for 80% of the cycle time as a result of the divider used, but this is not a constraint of the system.

The system is a synchronous type and the input event signal pulse is synchronized to the master clock signal P1 by two type D flip-flops IC1 and IC2. Wire W5 is connected to block B5, FIG. 2a, for routing pulse P2 through an events divider 62 and selector 64, which will be more fully described hereinafter (in FIG. 3a, counters IC29, IC30, externally accessible manual switches 66, 68, 70 and nand gate IC11). Assuming no division of input events, wire W7, FIG. 2a, will carry pulse P3, FIG. 4, from the output of block B7. This pulse is an inversion of P2 due to nand gate IC11, FIG. 3a. Wire W7 is connected to pin IC1-9 and wire W6 is connected to pin IC1-11 of type D flip-flop IC1, whereby pulse P3 is applied to the D-input and pulse P1 is applied to the clock input of the flip-flop. The logic state of P3 will be transferred to the Q-output of IC1 upon every positive transition of P1. The Q-output of IC1 applies pulse P4 to D-input of type D flip-flop IC2 by connection of pins IC1-13 and IC2-5. IC1-8 and IC2-4 are grounded whereby the set-input of flip-flop IC1 and the reset-input to flip-flop IC2 are low. An inverting hex gate IC44 has input pins IC44-6 and IC44-7, FIG. 3a, connected to W6 and output pin IC44-5 connected to IC2-3 whereby the inverse of the master clock signal P1 is applied to the clock input of flip-flop IC2, i.e. $\overline{P1}$ is applied to Pin IC2-3. This will cause the information applied to the D-input of IC2 at pin IC2-5 to be transferred to the $\overline{Q}$-output of IC2 upon the negative transition of the master clock signal P1. The $\overline{Q}$-output of IC2 is represented by pulse P5, FIG. 4, appearing at pin IC2-2. Pin IC1-13 is connected to pin IC48-8 of a nor gate IC48, FIG. 3a, and pin IC2-2 is connected to pin IC48-9, whereby, FIG. 2a, the Q-output of IC1 (Pulse P4) and the $\overline{Q}$-output of IC2 (Pulse P5) are combined by nor gate IC48 to generate signal pulse P6, FIG. 4, in wire W8 extending from block B6 at output pin IC48-10. Pulse P6 occurs during the high portion of one cycle of the master clock signal pulse P1 and will only occur once for each positive transition of the event signal pulse P3.

Wire W9 extends between blocks B6 and B11 such that pin IC48-10 is connected to pin IC3-3, FIGS. 2b and 3a, whereby the output of nor gate IC48 (P6) is applied to the clock input of flip-flop IC3. The D-input at pin IC3-5 will be more fully described hereinafter when it is explained how IC3 acts as an overrun detector. For the present discussion, it is assumed that the overrun signal pulse P7 emanating from the Q-output of IC3 remains in a high state. Wire W10 extends between blocks B11 and B8 connecting IC3-1, FIG. 3a, to IC20-1, FIG. 3e, whereby pulse P7 is applied to an input of nand gate IC20. Wire W8 extends between blocks B6 and B8 connecting IC48-10 to IC21-5 and to IC21-6, FIG. 3e, whereby pulse P6 is inverted by IC21. IC21-4 is connected to IC20-2 whereby $\overline{P6}$ and P7 are nanded by gate IC20 to generate signal pulse P8 at output pin IC20-3. P8 is P6 gated by overrun detector IC3; and if P7 remains in a high state, the signals P6 and P8 can be used interchangeably.

Figure 3E:
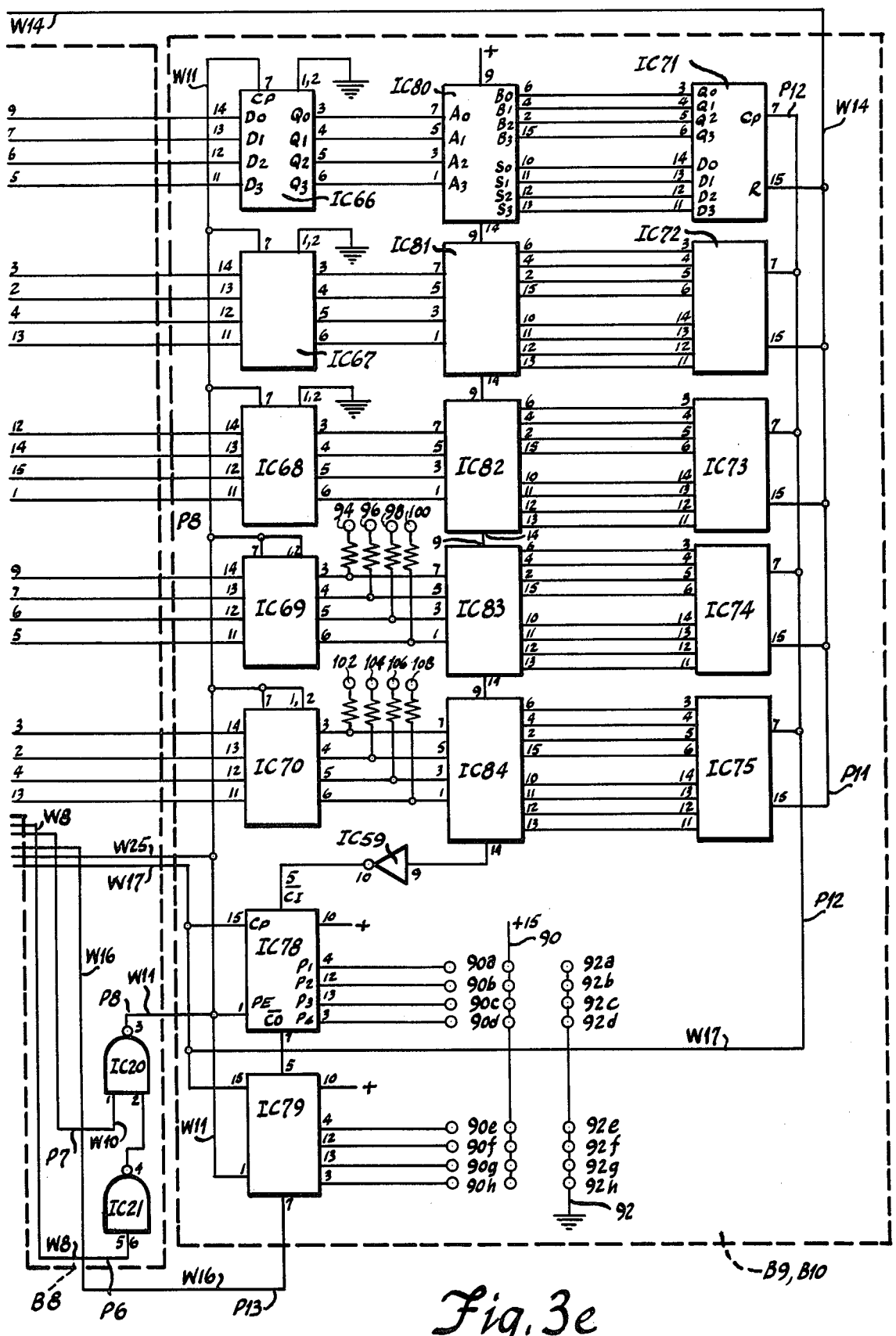

Wire W11 carries signal pulse P8 from block B8 to blocks B9 and B10 by connecting IC20-3, FIG. 3e, to IC78-1 and IC79-1, FIG. 3e, thereby applying P8 to the preset enable inputs of presettable counters IC78 and IC79. W11 is also connected to IC66-7, IC67-7, IC68-7, IC69-7 and IC70-7, thereby applying P8 to the clock inputs of quad D-type registers IC66, IC67, IC68, IC69 and IC70. IC66-1, IC66-2, IC67-1, IC67-2, IC68-1 and IC68-2 are grounded to thereby ground the A- and B- (output disable) inputs. IC69-1, IC69-2, IC70-1 and IC70-2 are connected to W11, whereby P8 is applied to the A- and B- (output disable) inputs.

The rising edge of signal P8 latches the contents of the period counter 72, FIG. 2c, into period latch memory 74 and resets the display counter 114, FIG. 2b, to zero during the remainder of the pulse. These operations will be described in detail hereinafter. The following is a brief description of the entry of counts into period counter 72 to enable an understanding of the latching and retention thereof performed by period latch memory 74. Count entry will also be further described hereinafter.

The period counter 72 comprises a pair of 12-bit binary counters IC76 and IC77, FIG. 3d. Referring to FIG. 2a and 2c, a pulse P9 emanates from the output of frequency divider 76 and inputs selector 78 in block B5. The frequency of P9 depends on the amount of division performed by blocks B5 and B7, FIG. 2a and 2b, upon the signal from crystal oscillator 52. If no further division is performed by either oscillator frequency divider 80 and inputs selector 82 in B7 or by frequency divider 76 and inputs selector 78 in B5, then signal P9 will have the same frequency as P1, as shown in FIG. 4. The divisions performed in B5 and B7 are related to period averaging, scaling and decimal point shifting, to be more fully described hereinafter. A wire W12 extends from B5 to B8 connecting pin IC10-6, FIG. 3a, to pin IC19-8, FIG. 3d, for carrying signal P9 from the output of nand gate IC10 to one of the inputs of nand gate IC19. Pin IC19-9 is connected to +15 volt DC terminal 22 of the power source, whereby the other input of IC19 is high. Pin IC19-10 is connected to pin IC76-10 whereby the output of nand gate IC19 ($\overline{P9}$) is applied to the clock input of counter IC76. Counter IC76 is triggered by the rising edge of $\overline{P9}$ and thus counter IC76 is incremented at the oscillation frequency of pulse P9. Additional capacity is provided by counter IC77 having its clock input (pin IC77-10) connected to the Q12-output (pin IC76-1) of counter IC76.

The number of P9 pulses recorded in the counters between first and second successive P8 (event) pulses is transferred into the period latch memory 74 (registers IC66 through IC70) upon the rising edge of said second P8 pulse; the rising edge of the third successive P8 pulse transfers the number of P9 pulses recorded between said second and said third P8 pulse, and so on. When the contents of the counters are latched into the registers 74, the calculation performed thereon is extremely fast and is completed before the next succeeding P8 pulse whereby to accomodate transfer of the period counter contents upon each P8 pulse and to permit a rate calculation to be performed for every interval between P8 pulses, not just alternate intervals, as will be more fully described hereinafter.

In order to insure that the contents of period counter 72 is transferred into period latch memory 74 before resetting the period counter to zero, a delayed reset signal P10, FIG. 4, is provided. Pulse P10 is pulse P6 delayed by 100 pf capacitor 84, FIG. 2b. Wire W13 connects W8 to the reset inputs of the counters, pins IC76-11 and IC77-11, FIG. 3d. W13 is grounded through capacitor 84 and has a 15 K ohm resistor 86 between the capacitor and the junction with W8. As seen in FIG. 4, reset pulse P10 is completed before the next P9 pulse occurs and thus the period counters IC76 and IC77 are ready to immediately begin measurement of the next period (interval until next P8 pulse).

Referring to FIG. 2c, the contents of period counter 72 (the number of P9 pulses accumulated in the interval between consecutive P8 pulses), when latched into memory 74, is divided into a constant by repetitive subtraction (actually inverse addition) and the number of subtractions performed is counted to give an indication of rate in units determined by the constant. The number of counts recorded in period counter 72 directly corresponds to the length of the interval between consecutive event pulses P8, i.e. the period. The reciprocal of this period gives the rate or frequency of input events, and multiplying this rate by a constant (or equivalently dividing the period into the constant) gives the rate in the desired engineering units.

The constant is set in block B9; a portion of the constant, the eight higher order bits, is loaded into presettable counters IC78 and IC79, and the remainder of the constant, the eight lower order bits, is loaded into calculation register 88, FIG. 2c. Referring to FIG. 3e, wire W11 is connected to IC78-1 and IC79-1 whereby pulse P8 is applied to the preset enable inputs of counters IC78 and IC79. Each of the P- inputs of these counters is selectively supplied with either a low or high logic sign from high and low buses 90 and 92, respectively. High bus 90 is connected to the +15 volt DC output terminal 22 of power source 2, and low bus 92 is grounded. The first preset input of IC78 may be set either high or low by connecting pin IC78-4 to terminal 90a of bus 90 or terminal 92a of bus 92, respectively. Likewise, pin IC78-12 is connected to 90b or 92b, pin IC78-13 is connected to 90c or 92c, pin IC78-3 is connected to 90d or 92d, pin IC79-4 is connected to 90e or 92e, pin IC79-12 is connected to 90f or 92f, pin IC79-13 is connected to 90g or 92g, and pin IC79-3 is connected to 90h or 92h. The eight terminal pairs 90a and 92a, 90b and 92b, etc., may be replaced by switch means or the like if desired. Pins IC78-10 and IC79-10 are connected to terminal 22 of the power source whereby the up-/down inputs of the counters are high. The rising edge of pulse P8 triggers the preset enable inputs of counters IC78 and IC79 whereby the logic states imposed on the preset inputs are gated into the counters. The choice of connections to buses 90 and 92 determines what "number" is entered into the counter, and this "number" is the abovementioned first portion (eight higher order bits) of the constant.

The remainder of the constant (the eight lower order bits) is loaded into calculation register 88, FIG. 2c, comprising quad D-type registers IC71, IC72, IC73, IC74, IC75, FIG. 3e. The rising edge of pulse P8 prepares the calculation register 88 for loading of the remainder of the constant by forcing the eight higher order bit outputs of period latch memory 74 into high impedance states as will presently be explained.

As aforenoted, wire W11 is connected to the high impedance inputs of IC69 and IC70 at pins IC69-1, IC69-2 and IC70-1, IC70-2, whereby pulse P8 is applied thereto. Each of the Q-outputs of registers IC69 and IC70 has an output resistor connected thereto. Each of these resistors can be connected to a logical 1 (high) or a logical 0 (low), and the resistance value is sized relatively large (typically 33 K ohm) with respect to the active output drive impedance so that they will not affect the state of the outputs of IC69 and IC70 when these outputs are active. Pin IC69-3 is connected to resistor 94 which may be grounded or connected to +15 volt DC terminal 22 of power source 2, whereby the Q0-output of register IC69 will assume the respective digital value when put into a high impedance state by pulse P8. For example, if resistor 94 is connected to terminal 22, then Q0 will be a logical 1 (high) when IC69 is triggered by P8 applied to IC69-1 and IC69-2; if resistor 94 is grounded, then Q0 will be a logical 0 when driven to a high impedance state by the high state of P8 applied to the high impedance input pins IC69-1 and IC69-2. The remaining resistors and Q-outputs interact comparably and are connected as follows: IC69-4 to resistor 96, IC69-5 to resistor 98, IC69-6 to resistor 100, IC70-3 to resistor 102, IC70-4 to resistor 104, IC70-5 to resistor 106, and IC70-6 to resistor 108. When driven to a high impedance state, the Q-outputs thus represent a second "number", the value of which is determined by the selected combination of resistor connections to 0 and 1. This second "number" is the remainder of the constant and is ready for loading into calculation register 88.

The remainder of the constant (the lower order eight bits) is loaded into the calculation register 88 through adder 110, FIG. 2c, comprising 4-bit full adders IC80, IC81, IC82, IC83, IC84, FIG. 3e. A pulse P11 (generation of which will be described hereinafter) occurs during the first half of P6, FIG. 4, and resets the calculation register 88 to zero. Wire W14 extends from block B7 through inverting hex buffer IC58, FIG. 3d, and is connected to IC71-15, IC72-15, IC73-15, IC74-15 and IC75-15, whereby pulse P11 is applied to the reset inputs of those registers, FIG. 3e. Referring to FIG. 2c, the A-inputs of the adder come from the Q-outputs of the period latch memory, the B-inputs of the adder come from the Q-outputs of the calculation register, and the S-outputs of the adder (sum of A and B) are delivered to the D-inputs of the calculation register. The pin connections are as follows, FIG. 3e: IC66-3 to IC80-7, IC66-4 to IC80-5, IC66-5 to IC80-3, IC66-6 to IC80-1, IC67-3 to IC81-7, IC67-4 to IC81-5, IC67-5 to IC81-3, IC67-6 to IC81-1, IC68-3 to IC82-7, IC68-4 to IC82-5, IC68-5 to IC82-3, IC68-6 to IC82-1, IC69-3 to IC83-7, IC69-4 to IC83-5, IC69-5 to IC83-3, IC69-6 to IC83-1, IC70-3 to IC84-7, IC70-4 to IC84-5, IC70-5 to IC84-3, IC70-6 to IC84-1, IC71-3 to IC80-6, IC71-4 to IC80-4, IC71-5 to IC80-2, IC71-6 to IC80-15, IC72-3 to IC81-6, IC72-4 to IC81-4, IC72-5 to IC81-2, IC72-6 to IC81-15, IC73-3 to IC82-6, IC73-4 to IC82-4, IC73-5 to IC82-2, IC73-6 to IC82-15, IC74-3 to IC83-6, IC74-4 to IC83-4, IC74-5 to IC83-2, IC74-6 to IC83-15, IC75-3 to IC84-6, IC75-4 to IC84-4, IC75-5 to IC84-2, IC75-6 to IC84-15, IC80-10 to IC71-14, IC80-11 to IC71-13, IC80-12 to IC71-12, IC80-13 to IC71-11, IC81-10 to IC72-14, IC81-11 to IC72-13, IC81-12 to IC72-12, IC81-13 to IC72-11, IC82-10 to IC73-14, IC82-11 to IC73-13, IC82-12 to IC73-12, IC82-13 to IC73-11, IC83-10 to IC74-14, IC83-11 to IC74-13, IC83-12 to IC74-12, IC83-13 to IC74-11, IC84-10 to IC75-14, IC84-11 to IC75-13, IC84-12 to IC75-12, and IC84-13 to IC75-11. Since the calculation register was reset to zero by pulse P11, its input to the adder is zero, i.e. the B-inputs to IC83 and IC84 from the Q-outputs of IC74 and IC75 are zero. The A-inputs to IC83 and IC84 are the second portion of the constant (the eight lower order bits), the "number" value of which is determined by the selected high and low connections of the eight resistors 94, 96, 98, 100, 102, 104, 106 and 108. The arithmetic sum of this second portion of the constant and the calculation register is thus equal to said second portion of the constant, and this will be the data imposed on the S-outputs of IC83 and IC84 and the D-inputs of IC74 and IC75. This data is transferred into IC74 and IC75 upon the first positive transition of signal pulse P12 which is applied to the clock inputs of registers IC71 through IC75 to gate the calculation register, as will be more fully described hereinafter. The addition (A+B=S) performed by the adder is thus entered into the calculation register by the first positive transition of P12, and since the B-input is zero, the data entered will be the A-inputs which are the lower eight order bits of the constant. Hence, the remainder of the constant has been loaded into the calculation register 88.

Generation of P11 in the first half of P6, FIG. 4, will now be described. W6 is connected to IC13-4 and IC13-5 whereby P1 is also applied to two of the inputs of 4-input nand gate IC13, FIG. 3b. IC31-11 is connected by wire W32 through inverter IC43 to IC13-3, whereby the Q1-output of counter IC31 is inverted and applied to another of the inputs of nand gate IC13. The remaining input of nand gate IC13 had P8 imposed thereon by wire W33 extending from W25, FIGS. 3b and 3c to IC13-2. P1 and P6 (and thus P8) are synchronized as aforedescribed. Since the Q4-output of IC31 (generating P1) is active for only two of the ten counts as IC31 is incremented to ten and since the Q1-output is simultaneously active for only one of said two counts, the output of IC13 will produce pulse P11 which is half the width of P6 when P8 is high. The Q4-output is active on counts 8 and 9, and Q1 is concurrently active only on count 9, and thus the nanding of $\overline{Q1}$, Q4 and P8 produces half width pulse P11, i.e. whereas P1, P6 and P8 are active 20% of the time, P11 is active only 10% of the time.

As shown in FIG. 4, pulse P12 is the inversion of master clock pulse P1. P12 is supplied from block B10, FIG. 2a, and is generated by the nanding of P1 and a carryout signal pulse P13 from counter IC79 which is high until the calculation is completed. As shown in FIGS. 2a and 3a, wire W15 extends from W6 and is connected to IC12-1 and IC12-2, whereby pulse P1 is applied to two of the inputs of 3-input nand gate IC12. A wire W16 extends from IC79-7, FIG. 3e, and is connected to IC12-8, whereby pulse P13 is applied to the other input of nand gate IC12. A wire W17 extends from IC12-9, FIG. 3a, and is connected to IC79-15, IC78-15, IC75-7, IC74-7, IC73-7, IC72-7, IC71-7, FIG. 3e, whereby pulse P12 is applied from the output of nand gate IC12 to the clock inputs of presettable counters IC78, IC79 and to the clock input of calculation register 88 (clock inputs of registers IC71 through IC75). Assuming P13 remains high (to be described more fully hereinafter), P12 will be the inversion of P1 as shown in FIG. 4.

Since the calculation register is edge triggered, it ignores the change to its inputs caused by the new sum outputs of the adder after the constant is loaded into the calculation register. Referring to FIG. 4 and FIG. 2c, an initiating event pulse P8 both marks the end of an interval and the beginning of a new interval. This pulse gates the flip-flop registers of the period latch memory whereby the contents of the period counter (number of clock pulses P9 accumulated between the present P8 pulse and the immediately preceding P8 pulse) is transferred to the Q-outputs of the period latch memory. However, the Q-outputs of IC69 and IC70, FIG. 3e, are driven to a high impedance state while P8 is high, whereby these Q-outputs are inactive for the duration of the P8 pulse and do not exhibit the data transferred from the period counter until P8 goes low. Thus when P8 is high, the data imposed on the A-inputs of adders IC83 and IC84 is determined by the logic connections of resistors 94 through 108. The data imposed on the A-inputs of IC80 through IC82 while P8 is high is insignificant because of the low order thereof. Reset pulse P11, FIG. 4, occurs before the rising edge of P12 and thus the calculation register is reset to zero before it is triggered to transfer the sum-outputs of the adder. Since the rising edge of pulse P12 occurs at the end of pulse P8 and since reset pulse P11 has been completed before the rising edge of P12, the data presented to the D-inputs of the calculation register from the S-outputs of the adder will be said second portion of the constant and it is this "number" which is transferred to the Q-outputs of the calculation register upon the rising edge of the P12 pulse. As aforenoted the master clock pulse P1 and the event pulse P8 are synchronized, and since P12 is the inversion of P1, P12 is inversely synchronized with P8, FIG. 4. The P12 pulse occurring at the beginning of the present interval, marked by event pulse P8, is the pulse which loads the constant into the calculation register upon its rising edge corresponding to the falling edge of P8. The value of this portion of the constant has been loaded by the time the next P12 pulse occurs and the calculation register does not transfer the change to its inputs caused by the new sum outputs of the adder until the rising edge of said next P12 pulse. The value of the constant is calculated for the units of rate required, knowing the frequency of the crystal oscillator and thus master clock pulse P1.

Division is performed by repetitive subtraction using a parallel adder network with two's complement arithmetic. Referring to FIG. 3e, IC80-9 is connected to +15 volt DC terminal 22, IC80-14 is connected to IC81-9, IC81-14 is connected to IC82-9, IC82-14 is connected to IC83-9, IC83-14 is connected to IC84-9, IC84-14 is connected to IC59-9 (the input of inverting hex buffer IC59), IC59-10 is connected to IC78-5, IC78-7 is connected to IC79-5, and IC79-7 is connected to wire W16 for transmitting carryout pulse P13, whereby the carry-ins and carry-outs of adders IC80 through IC84 and of presettable counters IC78, IC79, are respectively serially connected. IC78-10 and IC79-10 are connected to terminal 22. After the constant is loaded, the outputs of period latch registers IC69 and IC70 return to an active state because event pulse P8 goes low concurrently with the rising edge of P12, and thus the resistor constant setting (94 through 108), is disregarded for the remainder of the calculation. The value of the period latch memory (the number of P9 counts accumulated in period counter 72) is repeatedly subtracted from the value of the constant set in the calculation register and the presettable counters by signal pulses P12 until the presettable counters have subtracted to less than or equal to zero. The number of subtractions performed (the number of P12 pulses) is counted in block B11 and indicates the rate of input events.

When the presettable counters have subtracted to less than or equal to zero, the carryout pulse P13 of IC79 goes low indicating the division is complete. Since wire W16 connects IC79-7, FIG. 3e, to IC12-8, FIG. 3a, the negative transition of P13 causes pulse P12 to be gated off by nand gate IC12. Thus, the negative transition of carryout P13 prevents P12 from generating additional calculation pulses. Furthermore, the negative transition of P13 triggers a negative-edge triggered one-shot multivibrator 112, FIG. 2b, whose Q-output pulse P14 updates display means 114 to the value of the new calculated rate, as will be more fully described hereinafter. This new rate is latched and displayed via display drivers and display means until another rate calculation has been performed, i.e. until the next event signal P8.

In the preferred embodiment disclosed, the ratemeter is a four digit unit displaying four true significant figures. The number of registers, adders and counters needed to accomplish division accurately while maintaining full resolution is determined by the number of digits desired to be displayed. The present invention is not limited to a four digit unit nor to the number of registers, adders and counters shown. For example, the presettable counters may be replaced by additional adders and registers, but the use of the presettable counters is preferred because fewer components are used thus lowering cost.

The present invention affords an extremely fast response of rate indication by decreasing calculating time. When dividing the period (number of P9 pulses accumulated in period counter 72 between event pulses P8) into the constant, the whole value of the period is repetitively subtracted from the constant without having to count up to the period value before each subtraction. For example, in the four digit unit shown, the constant may be a maximum of about one hundred million and the longest period would be about ten thousand counts accumulated in period counter 72. Ten thousand is repetitively subtracted from one hundred million without having to count up to ten thousand prior to each subtraction. The unit counts up to ten thousand only once (before the first subtraction) and all subtractions are performed without having to wait for an incrementing operation to be completed upon the period value, i.e. the value of the period (the divisor) is incremented to during measurement of the period by period counter 72, and this period value is repetitively subtracted from the constant without re-incrementing to the period value prior to each subtraction. Reincrementing to the period value before each subtraction substantially increases calculating time; for example, the disclosed four digit unit enables a decrease in calculating time by a factor of ten thousand over such repetitive incrementation.

The present invention also provides a rate indication for every input event interval, not just every other interval, i.e. a calculation is performed on every period, not just alternate periods. The period counter is continuously incremented by clock pulses P9 and there is no off cycle to permit a rate calculation to be performed because each pulse P8 not only marks the end of one period but also marks the beginning of a new period. Thus while period counter 72 is counting P9 pulses occurring in the present interval to measure the present period, a rate calculation is simultaneously being performed on the number of P9 pulses which were counted in the immediately preceding interval. The unit does not require an "off" cycle after an "on" cycle in order to permit a rate calculation to be performed and thus is not constrained to measuring only intervals 1, 3, 5, 7 . . . while being "off" for intervals 2, 4, 6, 8 . . . ; rather, the unit measures every interval. While interval 4 is being measured, a rate calculation for interval 3 is being performed; while interval 5 is being measured, a rate calculation for interval 4 is being performed, etc. Due to the aforenoted fast calculation speed, the rate calculation is completed well in advance of the end of the interval (next P8 pulse), depending of course on the lower limits of the period to be measured which is a function of the response time of the integrated circuit components used and the desired balance of accuracy and resolution, as will presently be described.

The number of registers, adders and counters needed to accomplish division accurately while maintaining full resolution is determined by the rate equation. The maximum rate corresponds to the minimum period and thus:

$$\text{Max. rate} = \frac{\text{constant}}{\text{min. period}}$$

Since the system works with integer numbers, the constant is equal to (max. rate) X (min. period), and substituting into the above equation:

$$\text{Max. rate} = \frac{(\text{max. rate}) \times (\text{min. period})}{\text{min. period}}$$

To maintain resolution, the minimum size of the period number (number of P9 pulses) is essentially equal to the maximum rate (number of P12 pulses), i.e. the shortest period to be measured provides the smallest number of P9 clock pulses recorded in the interval between P8 event pulses, and this minimum number of P9 pulses corresponds to the maximum number of subtractions necessary which is the number of P12 pulses. This is shown by decreasing the rate, which corresponds to an increase in the period. Decreasing the rate by the minimum integer increment one corresponds to an increase of at least one in the period, thus:

$$(\text{Max. rate}) - 1 = \frac{(\text{Max. rate}) \times (\text{Min. period})}{(\text{Min. period}) + 1}$$

For a four digit unit, the maximum rate number is 9999, thus:

$$9998 = \frac{(9999) \times (\text{Min. period})}{(\text{Min. period}) + 1} \quad \text{Min. period} = 10,000$$

Likewise for a five digit unit, the minimum period number is 100,000, and for a six digit unit the minimum period number is 1,000,000, etc. Since the minimum size of the period number is five digits for a four digit rate indication, the last four digits of the constant are not significant and thus not set because the system is an integer system and fractions are ignored. Likewise for a five digit rate indication, the last five digits of the constant can be ignored, etc.

To indicate a rate of 1 would require that the period number be larger than ½ of the constant size and resolution would be lost since the period can vary anywhere between the constant number and ½ the constant number with the resultant rate indication of 1. Scaling the period by a factor of 10, 100 or 1,000 and locating a decimal point in the units, tens, hundreds or thousands place of the rate indication, respectively, will restore resolution to the indication and decrease the number of components needed to construct the divider circuits in blocks B5 and B7, described hereinafter. The number of significant digits is increased from one (0001) to four (1.000). The decimal point floats and correspondingly scales the period number by factors of 1, 10, 100 and 1,000. Each decimal position is thus optimized to provide four true significant digits for any rate. Providing hysteresis to the decimal point shift reduces the number of significant digits to three (minimum) but increases readability of the rate.

P12 pulses are counted by dual BCD up counters IC35, IC36, IC37, IC38, FIG. 3c, corresponding to counter 114, FIG. 2b. Wire W17 is also connected to the enable input of counter IC35, IC35-10. IC35-14 is connected to IC36-2, IC36-6 is connected to IC37-10, IC37-14 is connected to IC38-2. IC35-9, IC36-1, IC37-9 and IC38-1 are grounded whereby the clock inputs of these counters are connected to a logical low and hence the counters are incremented by the enable signal provided by P12. The Q-outputs of these counters are connected to BCD-to-seven segment latch/decoder/drivers IC61, IC62, IC63, IC64, FIG. 3c, representing the units, tens, hundreds, and thousands places, respectively. The connections are as follows: IC35-11 to IC61-7, IC35-12 to IC61-1, IC35-13 to IC61-2, IC35-14 to IC61-6, IC36-3 to IC62-7, IC36-4 to IC62-1, IC36-5 to IC62-2, IC36-6 to IC62-6, IC37-11 to IC63-7, IC36-12 to IC63-1, IC37-13 to IC63-2, IC37-14 to IC63-6, IC38-3 to IC64-7, IC38-4 to IC64-1, IC38-5 to IC64-2, IC38-6 to IC64-6, whereby the Q1- through Q4- outputs of the counters are applied to the A- through D- inputs, respectively, of the latch-decoder/drivers. An LED (light emitting diode) display is used and the output pins 13, 12, 11, 10, 9, 15, 14 of the drivers are connected through appropriate resistances to the input pins 1, 13, 10, 8, 7, 2, 11, respectively, of the LED1, LED2, LED3, LED4; pins LED1-3, LED2-3, LED3-3, LED4-3 are connected to terminal 22. A logical high is applied to the lamp test ($\overline{LT}$) input and blanking ($\overline{BI}$) inputs of the drivers by connecting respective pins 3 and 4 to terminal 22. The number of subtractions performed is thus counted by counters IC35 through IC38 until P12 is gated off by nand gate IC12 in response to the negative transition of carryout pulse P13 indicating completion of the division.

Decimal point shifting will now be functionally described with reference to FIG. 2, after which a detailed description will be given with reference to FIG. 3.

Four decimal point locations, DP1 through DP4, are needed to optimize significant digits for a four figure rate indication, LED1 through LED4. The decimal point position (i.e. whether the decimal point in LED1, LED2, LED3, or LED4 will be lighted) is defined by the state of a universal bi-direction shift register 116 delay-gated by a quad register 118 into decimal point driver and display means 120 comprising the decimal point illuminators in LED1 through LED4. Shift register 116 and register 118 each have an input, 116-1 and 118-1, connected high, and three inputs, 116-2, 116-3, 116-4 and 118-2, 118-3, 118-4, connected low, whereby at power turn-on or reset, block B1, the shift register is initialized to 0001 which defines the rightmost decimal point DP1 to be a logical 1 and DP2, DP3, DP4 to be a logical zero, thereby placing the decimal point in LED1. The outputs DP1 through DP4 of shift register 116 are applied to the D-inputs of register 118 and the Q-outputs of 118 apply DP1 through DP4 to 120 including connections to LED1-9, LED2-9, LED3-9 and LED4-9, respectively.

The shift register is clocked by a signal P15 and the direction of the shift is controlled by a display counter overflow signal P16. Signal P15 is generated if and only if the counter overflow exceeds 9999 or underflows the defined hysteresis number, in this case 0900. The hysteresis number can be arbitrarily chosen to be any desired number and is a compromise between displaying the maximum number of significant digits and optimizing the visual effect of the display so as not to calculate and display rates faster than can be visually understood and retained.

Underflow is detected by a zero detector in the 1,000's position nanded with a nine detector in the 100's position. The zero detector comprises a dual 4- input nor gate IC85, IC86 connected to the Q1- through Q4-outputs of the thousands decade counter; this zero detector outputs a logical 1 when the thousands decade is at zero. The nine detector comprises a 2-input nand gate IC22 connected to the Q1- and Q4- outputs of the hundreds decade counter; this nine detector outputs a logical 0 when the hundredth decade of the display count is a nine. The zero and nine detectors are nanded by IC23 producing signal P17 which is low only when the display count number is less than 0900.

Overflow of the display counter is detected by a positive transition of the zero detector latching the $\overline{Q}$-output P16 of flip-flop IC4 into a low state. P16 and P17 are nanded by IC24 to produced signal P18 which is nanded by IC25 with the $\overline{Q}$- output P19 of negative-edge triggered one-shot multivibrator 112, whereby pulse P19 is gated through IC25 to cause a shift (by P15) if and only if the display count number is less than 0900 or an overflow has occurred. The direction of the shift is controlled by the absence (shift left) or presence (shift right) of a counter display overflow P16. All detectors and display counters are reset at the beginning of the next calculation by P8.

The shifted state of shift register 116 is not immediately transferred to decimal point display means 120 during the present interval when the underflow or overflow occurs because the display counter means (including LED1 through LED4) is indicating the rate for the previous interval. Upon the occurrence of the next event signal P8 (end of present interval and beginning of next interval), the presettable counters are enabled again whereby carryout P13 goes high causing the Q-output of one-shot multivibrator 112 to go high whereby the pulse P14 clocks register 118 to transfer the DP1 through DP4 outputs of 116 to the decimal point display means 120. The decimal point is thus shifted when the rate indication has been updated.

Frequency division for decimal point shifting is performed divider 80, FIG. 2b, comprising three decade counters IC32, IC33, IC34. Three decades are used for a four figure display. The outputs of 80 for decimal point shifting are: the frequency of P1; P1 frequency divided by 10; P1 frequency divided by 100; and P1 frequency divided by 1,000. These outputs are inputed to selector means 82. The selector means is controlled by the decimal point outputs of shift register 116 such that: DP1 selects P1; DP2 selects P1 divided by 10; DP3 selects P1 divided by 100; and DP4 selects P1 divided by 1,000. The output of selector 82 is signal P20 which is applied to divider 76 and selector 78, FIG. 2a, and corresponds to the decimal point shift by determining the rate at which period counter 72 will increment (P9) between event signal pulses P8.

Decimal point shifting will now be described in greater detail by reference to FIG. 3 which shows in greater detail the arrangement of FIG. 2 except that register 118 has been omitted to exemplify one of many possible modifications.

The universal bi-direction shift register 116 of FIG. 2b, is available as a single component, or, for example, can be embodied by quad data selector IC65, FIG. 3b, and flip-flops IC5 through IC8, FIG. 3d. Wires W18, W19, W20, W21 are connected to pins IC65-4, IC65-2 and IC65-7, IC65-15 and IC65-5, IC65-3, respectively, whereby DP1, DP2, DP3, DP4 are fed back to the X1, X2 and Y0, X3 and Y1, and Y2 inputs of the quad data selector. Pins IC65-6, IC65-1 are grounded, whereby the X0 and Y3 inputs are connected low. The Z- outputs of the data selector are applied to the D-inputs of type D flip-flops IC5 through IC8 by the following connections: IC65-10 to IC5-5, IC65-11 to IC6-9, IC65-12 to IC7-5, IC65-13 to IC8-9. The Q-outputs of these flip-flops are transmitted through inverting hex buffers IC54 through IC57 to wires W18 through W21, the pin connections being as follows: IC5-2 to IC54-3 and IC54-2 to W18; IC6-12 to IC55-5 and IC55-4 to W19; IC7-2 to IC56-14 and IC56-15 to W20; IC8-12 to IC57-11 and IC57-12 to W21. The reset inputs of flip-flops IC6 through IC8, pins IC6-10, IC7-4, IC8-10, and set input of flip-flop IC5, IC5-6, are connected to block B1 for initialization purposes at power turn-on or reset. W18 through W21 are connected to LED1-9, LED2-9, LED3-9, LED4-9, respectively, whereby the Z0- through Z3- outputs of IC65 gated by registers IC5 through IC8 and inverting buffers IC54 through IC57 provide the DP1 through DP4 signals, respectively, for decimal point positioning and shifting.

DP1 through DP4 are gated by pulse P15 applied to the clock inputs of flip-flops IC5 through IC8 by means of wire W22 connecting IC25-3, FIG. 3c, to IC8-11, IC7-3, IC6-11 and IC5-3, FIG. 3d. The decimal point is shifted in response to P15 and, as aforenoted, P15 is generated if and only if the display counter underflows or overflows. Underflow and overflow detection are accomplished as aforedescribed, the connections, FIG. 3c, being as follows: IC37-11 to IC22-13; IC37-14 to IC22-12; IC38-3 to IC85-12; IC38-4 to IC85-11; IC38-5 to IC85-10; IC38-6 to IC85-9 and to IC86-2 through IC86-5; IC85-13 to IC23-8; IC22-11 to IC23-9; IC86-1 to IC4-11; terminal 22 to IC4-9; IC4-8 to ground; IC4-12 to IC24-6; IC23-10 to IC24-5; IC24-4 to IC25-2; IC45-4 to IC25-1; and IC25-3 to W22 for transmitting P15.

The one-shot multivibrator 112 of FIG. 2b, comprises FIG. 3c, a 220pf capacitor 122 connected at one plate to W16 and at the other plate to 33 K ohm resistor 125 which is connected to 2-input nor gate IC45 at pins IC45-5 and IC45-6, and also comprises a 33 K ohm resistor 126 connected between terminal 22 and the junction of 122 and 124. As aforenoted, the output of nand gate IC23 (P17) goes low when an underflow occurs, and the $\overline{Q}$-output of flip-flop IC4 (P16) goes low when an overflow occurs. P16 and P17 are nanded by IC24 to produce P18 which is low when an underflow or overflow occurs. The low transition of carryout P13 from IC79-7 (indicating completion of a calculation) triggers one-shot multivibrator and the inversion performed by IC45 thus produces P19 which goes high when P13 goes low. P18 and P19 are nanded by IC25 to generate P15 which goes high when an underflow or overflow occurs and thus clocks flip-flops IC5 through IC8 to transfer the outputs of IC65 to the DP1 through DP4 inputs of LED1 through LED4.

The direction of a decimal point shift is controlled by the outputs of flip-flop IC4. As aforenoted, the $\overline{Q}$-output of IC4 (P16) goes low when an overflow occurs. This $\overline{Q}$-output is also applied to the A-input of IC65 by means of wire W23 connecting IC4-12 to IC65-9. The Q-output of IC4 applies a signal P21 to the B-input of IC65 by means of wire W24 connecting IC4-13 to IC65-14. Thus upon overflow, P21 goes high and causes the decimal point to shift left by changing outputs Z0 through Z3 of IC65 which, when clocked by IC5 through IC8, change the logical states of DP1 through DP4. When P16 is high and P15 is high, then an underflow has occurred and IC65 shifts the decimal point right. All detectors and display counters are reset at the beginning of the next calculation by P8 applied through wire W25 from W11 to pins IC4-10, IC38-7, IC37-15, IC36-7, IC35-15.

Referring to FIG. 3b, frequency division and selection for decimal point shifting is accomplished by dual BCD up counters IC32, IC33, IC34, by 2-input nand gates IC15 through IC18, and by 4-input nand gate IC14, corresponding to divider 80 and selector 82 of FIG. 2b. As aforedescribed, the frequency of the one megahertz crystal oscillator is divided by ten by IC31 to produce master clock pulse P1 having a frequency of one hundred kilohertz (100 KHz). The frequency of P1 is divided by counters IC32 through IC34 generating pulses P22 through P24, respectively, P22 having a frequency of 10 KHz, P23 having a frequency of 1 KHz, and P24 having a frequency of 100 Hz. IC31-9, IC32-1, IC33-9, and IC34-1 are grounded so that the clock inputs of these counters are low, whereby they may be incremented by the low signals from inverter IC42. The crystal oscillator frequency signal is applied to the enable input of counter IC31 by connection of pin IC42-3 to pin IC31-10. The Q4- output of IC31 is applied to the enable input of IC32 by connection of IC31-14 to IC32-2. The Q4- output of IC32 is applied to the enable input of IC33 by connection of IC32-6 to IC33-10. The Q4- output of IC33 is applied to the enable input of IC34 by connection of IC33-14 to IC34-2. The Q4- output of IC31 (pulses P1) is nanded by IC15 with DP1, IC31-14 being connected to IC15-1 and W18 being connected to IC15-2. The Q4- output of IC32 (pulse P22 occurring only on every tenth P1) is nanded by IC16 with DP2, IC32-6 being connected to IC16-6 and W19 being connected to IC16-5. The Q4- output of IC33 (pulse P23 occurring only on every hundredth P1) is nanded by IC17 with DP3, IC33-14 being connected to IC17-13 and W20 being connected to IC17-12. The Q4-output of IC34 (pulse P24 occurring only on every thousandth P1) is nanded by IC18 with DP4, IC34-6 being connected to IC18-8 and W21 being connected to IC18-9. The outputs of nand gates IC15 through IC18 are inputed to nand gate IC14, the pin connections being IC15-3 to IC14-12, IC16-4 to IC14-11, IC17-11 to IC14-10, and IC18-10 to IC14-9.

Considering, for example, the situation where DP1 is high and DP2, DP3 and DP4 are low (0001), the nanding of negatively recurring P1 with the positive DP1 generates a high pulse P25 upon every low transition of P1, while the nanding of P22 and DP2, of P23 and DP3, and of P24 and DP4 produce low signals P26, P27 and P28, respectively, occuring every 10th, 100th and 1,000th P1, respectively. The nanding of P25 (high) and P26 through P28 (low) generate positive pulse P20 recurring at the same rate as P1.

Considering, as another example, the situation where DP3 is high and DP1, DP2 and DP4 are low (0100), the nanding of negatively recurring P23 with the positive DP3 generates pulse P27 high upon every negative transition of P23 (every hundredth P1), while P25, P26 and P28 recurr low at the rate of P1, P22, and P24, respectively. The nanding of P27 (high every 100th P1) with P25, P36 and P28 (low every P1, 10th P1, and 1,000th P1, respectively) thus generates positive pulse P20 recurring at a frequency P1 ÷ 100, i.e. 1 KHz.

Wire W26 applies pulse P20 to block B5, FIGS. 2a and 3a, and W12 transmits P9 to increment the period counter 72 (IC76 and IC77), FIGS. 2c and 3d. It is thus seen that the logic states of DP1 through DP4 (which are determined by the Z0 through Z3 outputs of IC65) control the frequency of P20 which in turn determines the frequency at which the period counters will increment in the interval between event pulses P8. DP1 selects P1, DP2 selects P22, DP3 selects P23, and DP4 selects P24. A decimal point shift thus changes the number of counts (P9 pulses) accumulated in period counters IC76 and IC77 by the appropriate power of ten which in turn changes the quotient of the constant and the period, thus producing a rate indication compensating the shifted decimal point by assigning new decade place values.

Period averaging will now be functionally described with reference to FIG. 2a, after which a detailed description will be given with reference to FIG. 3a.

The period averaging function is performed by two sets of dividers 76 and 62 to provide several frequencies and by two sets of selector means 78 and 64. Divider 62 is placed in series with the event input signal line W5 for dividing the recurrence rate of event pulses P2, and the other divider 76 is placed in series with the clock output line W26 of the decimal point dividers for dividing the recurrence rate of clock pulses P20. Divider 76 outputs various frequencies of P20, and divider 62 outputs various frequencies of P2; for example 76 may divide the frequency of P20 by 1, by some number M1, and by some other number M2, etc., as may 62 divide the frequency of P5 by N1, N2, etc. If the selectors 78 and 64 select the same divisor outputs of 76 and 62, respectively, for example M1 and N1, where M1 = N1, then the rate calculated from the P9 counts accumulated in period counter 72, FIG. 2c, will be the true arithmetic average of rate of events over the total N1 events because a calculation is not performed until the programmed number N1 of event input pulses P2 have occurred.

The selectors 78 and 64 provide external selection of the frequency division of each signal P20 and P2 to optimize the ratemeter for its intended application. When both signals are divided by the same number then period averaging occurs and the number of periods averaged is the number selected from dividers 76 and 62. When signals P2 and P20 are not divided equally, then scaling occurs. Scaling extends the range of the ratemeter and alters the rate indication by the scaled number.

Referring now to FIG. 3a, BCD up counters IC29 and IC30 correspond to divider 62 of FIG. 2a, and switches 66, 68, 70 and 3- input nand gate IC11 correspond to selector 64. IC29-9 and IC30-1 are grounded so that the clock inputs of these counters are low whereby they may be incremented by low transitions of P2 at their enable inputs. W5 is connected to pin IC29-10 and IC29-14 is connected to IC30-2. IC29 divides the frequency of P2 by ten since its Q4- output generates a negative pulse P29 every tenth P2 pulse. IC30 divides the frequency of P2 by one hundred since its Q4- output generates a negative pulse P30 every hundredth P2 pulse (every tenth P29 pulse). In the context of FIG. 2a, N1 would be 10 and N2 would be 100. W5 is connected through switch 66, when closed, to IC11-11; IC29-14 is connected through switch 68, when closed, to IC11-12; and IC30-6 is connected through switch 70, when closed, to IC11-13. 1 K ohm resistors 128, 130 and 132 may be placed in series with the inputs of nand gate IC11. Switches 66, 68, 70 are externally accessible and in their open position connect IC11-11, IC11-12, IC11-13 through 33 K ohm resistors 134, 136, 138, respectively, to +15 volt DC terminal 22.

Thus, for example, with switch 66 closed, and 68 and 70 open, P2 will be inputed to NAND gate IC11 while the other two inputs will be in a high state. Since P2 pulses are negative, the nand gate will generate positive pulse P3 recurring at the same frequency as P2. P3 is gated through B6 and produces event pulse P8 having the same frequency as input event pulse P2. Hence no period averaging is performed and a rate calculation is performed and indicated for every interval between events P2 which is the same interval between P8 event pulses.

As another example, with switch 68 closed, and 66 and 70 open, the IC11-12 input will have negative pulse P29 applied thereto, while the other inputs of nand gate IC11 are high. Positive output pulse P3 thus recurrs at the frequency of P29, i.e. every tenth P2. Now P8 will be generated only on every tenth input event P2 and thus a rate calculation (while still performed for every interval between P8 pulses) is performed and indicated for every tenth event P2 and, if P20 is also divided by 10, the period is averaged over 10 input event intervals.

BCD up counters IC27 and IC28 correspond to divider 76 of FIG. 2a, and switches 140, 142, 144 and 3-input nand gate IC10 correspond to selector 78. IC27-9 and IC28-1 are grounded so that the clock inputs of these counters are low whereby they may be incremented by low transition of P2 at their enable inputs. W26 is connected to IC27-10 and IC27-14 is connected to IC28-2. IC27 divides the frequency of P20 by ten by generating negative pulse P31 at its Q4- output every tenth P20 pulse. IC28 divides the frequency of P20 by one hundred by generating negative pulse P32 at its Q4-output every hundredth P20 pulse (every tenth P31 pulse). In the context of FIG. 2a, M1 would be 10 and M2 would be 100. W26 is connected through switch 140, when closed, to IC10-5; IC27-14 is connected through switch 142, when closed, to IC10-4; and IC28-6 is connected through switch 144, when closed, to IC10-3. 1 K ohm resistors 146, 148, 150 may be placed in series with the inputs of nand gate IC10. Switches 140, 142, 144 are externally accessible and in their open condition connect IC10-5, IC10-4, IC10-3 through 33 K ohm resistors 152, 154, 156, respectively, to +15 volt DC terminal 22.

With switch 140 closed, and 142 and 144 open, negative pulse P20 wil be inputed to nand gate IC10 at IC10-5 while the other two inputs will be in a high state. The nand gate will output positive pulse P9 recurring at the same frequency as P20 and thus period counters IC76 and IC77, FIG. 3d, will increment at the frequency determined by the decimal point dividers which generated P20.

If switch 144 is closed, and 140 and 142 are open, then P9 is generated every hundredth P20, and the period counters IC76 and IC77 increment 100 times slower than the frequency of the output P20 of the decimal point dividers.

The number of periods over which averaging may be performed is programmable and the arbitrary number is not a limitation of the invention. The commercialized version of the ratemeter enables an updated rate indication after every 1, 10 or 100 input events (P2). This provides a "smoothing" action when input pulses are randomly spaced, such as bunching on an assembly line. The single period mode is obtained with switches 140 and 66 on, and 142, 144, 68 and 70 off. The 10 period sample mode is obtained with switches 142, and 68 on, and 140, 144, 66 and 70 off. The 100 period sample mode is obtained with switches 144 and 70 on, and 140, 142, 66 and 68 off.

Overrun prevention will now be described. The time needed to perform a rate calculation is normally much less than the time interval between successive event pulses P8. However, event pulses must not occur during a rate calculation, and overrun detector IC3, FIG. 2b and FIG. 3a, is provided to detect such occurrence.

IC3 is a type D flip-flop whose Q-output P7 is high for normal operation and is inputed to 2-input nand gate IC26 for nanding with carryout signal P13, FIG. 2b. Wire W10 connects IC3-1, FIG. 3a, to IC26-12, FIG. 3d, and a wire W27 extends from W16 to IC26-13, FIG. 3d. P13 is high when a calculation is in progress. If P13 is high when event pulse P6, and thus P8, occurs, then the previous calculation has not been completed. Since P7 is high and P13 is now high, the output P33 of IC26, FIG. 2b, goes low. P33 is applied to the D-input of flip-flop IC3 by a wire W28 connecting IC26-11, FIG. 3d, to IC3-5, FIG. 3a. The negative transition of P33 at the D-input of IC3 latches the Q-output P7 of IC3 low.

Upon the positive transition of P33 (an overrun condition), the Q-output P34 of IC3 goes high which triggers indicator means 158, FIG. 2b, to visually show that overrun has occurred. A wire W29 connects IC3-2, FIG. 3a, to IC60-5, FIG. 3c, IC60-4 is connected through resistor 160 to a light emitting diode 162 which is connected to +15 volt DC terminal 22. The high P34 is thus inverted by IC60 whereby a voltage is developed across LED 162 between high terminal 22 and now low pin IC60-4.

The negative transition of P7 upon overrun triggers one-shot multivibrator 164, FIG. 2a, which will initialize the entire unit back to a power-on state to permit the unit to accept the next event input. Referring to FIG. 3a, a wire W30 extends from W10 to connect IC3-1 to one plate of a 0.001 $\mu$f capacitor 166, the other plate of 166 is connected through resistor 168 to pin IC39-14 of the reset circuit (to be described hereinafter) said other plate of 166 is also connected through resistor 170 to terminal 22 of the power source.

When P7 is low, P8 will be held high by nand gate IC20, FIG. 2b. This is because after the event input causing the overrun (and before the next event) the pulse P6 goes back low, the inversion of which by IC21 is high at the input to IC20, FIG. 2b and FIG. 3e. With P8 held high, the display counters 114, FIG. 2b, will be held in reset to display a value of zero since W25 extends from W11, FIGS. 3e and 3c and is connected to IC38-7, IC37-15, IC36-7 and IC35-15, FIG. 3c, whereby P8 is applied to the reset inputs as aforedescribed.

When the next event pulse P6 occurs, flip-flop IC3 is clocked and P7 is latched back high because P33 is now high due to the low P7 previously generated. The overrun detector is thus reset and allows the unit to begin accumulating a new period.

The above discussion on event input speed does not represent a limitation on the invention since the unit can calculate and display rates faster than can be visually understood. Of course, the faster the crystal oscillator frequency, the shorter the calculating time. Also, the period average function may be used to extend the high speed input range by slowing the speed at which input events are recognized.

Power turn-on and reset, blocks B1 and B3a, will now be described. Referring to FIG. 3a, the reset terminal is connected through a 33 K ohm resistor 172 and inverting hex buffers IC52, IC53 to one of the inputs of nand gate IC39, the connections being: reset to 172, 172 to IC52-9; IC52-10 to IC53-7; and IC53-6 to IC39-15. A 150 K ohm resistor 174 is connected across pins IC52-9 and IC53-6 to be in parallel with inverters IC52 and IC53. A 3.3 K ohm resistor 176 is connected between +15 volt terminal 22 of the power source and the junction of the reset, terminal and resistor 172. A 0.47 µf capacitor 178 is connected between ground and the junction of the reset terminal and resistor 172. The output of nand gate IC39 is connected to various components in the ratemeter for initializing the unit at power turn-on or reset. Pin IC39-13 is connected by wires, cumulatively designated W31, to the following reset pins of components: IC30-7; IC29-15; IC28-7; IC27-15; IC1-10; IC2-6; IC3-4; IC31-15; IC32-7; IC33-15; IC34-7; IC5-6; IC6-10; IC7-4; IC8-10.

It is recognized that numerous variations of the disclosed preferred embodiment are possible. While period latch memory 74 is preferred, many other types of memory means and arrangements are possible. For example, two sets of period counters may be used, the first set timing the present interval and the second set performing the memory function by applying its contents (the immediately preceding period) to the divider. Upon the next event pulse, the second set is reset and begins timing the new interval, and the first set now applies its acumulated contents to the divider. In this way a memory function is performed which alleviates re-incrementing to the value of the divisor (period) before each substraction by using two sets of period counters alternately incremented by the clock pulses. Each interval between consecutive event pulses is measured and clock pulses are continuously incremented. The memory means thus enables measurement of the present period to occur simultaneously with rate calculation for the immediately preceding period.

Another possible modification is to reset the period counter to a value other than zero, for example, when it is desirable to load a constant into the period counter such that the contents thereof applied as the divisor to the divider is the number of accumulated clock pulses plus said constant.

Other variations are possible within the scope of the appended claims.

We claim:
1. A ratemeter comprising:
 clock means generating clock pulses at a known frequency;
 means responsive to recurring input events to generate event pulses defining event periods;
 period counter means for accumulating said clock pulses;
 means responsive to said event pulses for dividing the contents of said period counter means accumulated during a previous event period into a known constant simultaneously with accumulation by said period counter means of clock pulses occurring in the present event period; and
 means responsive to said dividing means to provide a signal representative of the rate of recurrence of said input events.

2. A ratemeter according to claim 1 comprising display means responsive to said signal to display said rate.

3. A ratemeter comprising:
 clock means generating clock pulses at a known frequency;
 means responsive to recurring input events to generate event pulses;
 period counter means continuously incremented by said clock pulses;
 divider means for dividing a divisior into a known constant;
 means responsive to each event pulse to apply the contents of said period counter means to said divider means as said divisor and reset said period counter means to a designated value, whereby said period counter means measures every period between consecutive event pulses, each event pulse both terminating the previous period and beginning the new period; and
 means responsive to said divider means to provide a signal representative of the rate of recurrence of said input events as a function of said period between consecutive event pulses.

4. A ratemeter according to claim 3 comprising display means responsive to said signal to display said rate in units determined by said constant.

5. A fast response ratemeter comprising:
 clock means generating clock pulses of a known frequency;
 means responsive to recurring input events to generate event pulses;
 period counter means incremented by said clock pulses;
 divider means for dividing a divisor into a known constant by repetitively subtracting said divisor from said constant;
 memory means responsive to said event pulses for retaining the number of said clock pulses incremented by said period counter means between event pulses and applying said number as said divisor to said divider means whereby incrementation to the value of said divisor is necessary only before the first subtraction in the division operation performed by said divider means; and
 means responsive to said divider means to provide a signal representative of the rate of recurrence of said input events as the reciprocal of the period between event pulses.

6. A ratemeter according to claim 5 comprising display means responsive to said signal to display said rate in units determined by said constant.

7. A ratemeter according to claim 5 wherein said last mentioned means counts the number of subtractions performed by said divider means whereby said signal represents said number of subtractions.

8. A ratemeter comprising:
 clock means generating clock pulses of a known frequency;
 means responsive to recurring input events to generate event pulses;
 period counter means continuously incremented by said clock pulses;
 divider means for dividing a divisor into a known constant by repetitively subtracting said divisor from said constant;
 means responsive to each event pulse to apply the contents of said period counter means to said divider means as said divisor and reset said period counter means to a designated value, and including memory means for retaining said contents whereby incrementation to the value of said divisor is necessary only before the first subtraction in the division calculation performed by said divider means to thus provide fast response and enable said period counter means to measure every period between consecutive event pulses, each event pulse both terminating the previous period and beginning the new period; and display means responsive to said divider means to display the rate of recurrence of said input events as the reciprocal of the period between event pulses in units determined by said constant.

9. A ratemeter according to claim 8 further comprising decimal point shift means for indicating the order of magnitude of said displayed rate and comprising:

overflow detector means for detecting an overflow condition wherein said rate exceeds a predetermined value;

underflow detector means for detecting an underflow condition wherein said rate is less than another predetermined value; and means responsive to said overflow detector means and said underflow detector means to shift the order of magnitude of said displayed rate and to alter the frequency of said clock pulses incremented by said period counter means.

10. A ratemeter according to claim 9 wherein said means responsive to said overflow and underflow detector means comprises bi-directional shift register means comprising:

data selector means controlled by said overflow and said underflow detector means; and register means inputed from said data selector means and clocked only in response to either an overflow or an underflow condition.

11. A ratemeter according to claim 10 wherein said means responsive to said overflow and underflow detector means further comprises:

one or more counters incremented by said clock pulses to divide the frequency of said clock pulses;

means gating the outputs of said last mentioned counters with the outputs of said register means whereby said outputs of said register means control the frequency of said clock pulses incremented by said period counter means.

12. A ratemeter according to claim 8 further comprising period averaging means comprising:

event pulse divider means for dividing the frequency of said event pulses by N, where N is an integer greater than or equal to one;

clock pulse divider means for dividing the frequency of said clock pulses by M, where M is an integer greater than or equal to one;

whereby if M equals N, then the rate displayed will be averaged over N periods, and if M does not equal N, then the rate displayed will be scaled by the ratio thereof.

13. A ratemeter according to claim 8 further comprising overrun detector means detecting the occurrence of an event pulse when the division performed by said divider means is in progress, and means responsive thereto to indicate such overrun condition.

14. A ratemeter according to claim 8 wherein said means responsive to each event pulse comprises reset means for resetting said period counter means after said contents have been retained by said memory means and before the next succeeding clock pulse.

15. A ratemeter according to claim 8 further comprising means synchronizing each event pulse to a clock pulse.

16. A ratemeter according to claim 15 wherein said synchronizing means comprises a pair of flip-flops clocked by said clock pulses and by inversions of said clock pulses, respectively, one of said flip-flops being data inputed by said event pulses, the other of said flip-flops being data inputed by one of the outputs of said one flip-flop, and means gating said one output of said one flip-flop with the opposite type output of said other flip-flop.

17. A ratemeter according to claim 8 wherein said display means comprises display counter means for counting the number of subtractions performed by said divider means.

18. A ratemeter according to claim 8 further comprising:

(a) decimal point shift means for indicating the order of magnitude of said rate and comprising:
  (i) overflow detector means for detecting an overflow condition wherein said rate exceeds in predetermined value;
  (ii) underflow detector means for detecting an underflow condition wherein said rate is less than another predetermined value; and
  (iii) means responsive to said overflow detector and said underflow detector to shift the order of magnitude of the rate displayed and to alter the frequency of said clock pulses incremented by said period counter means;

(b) period averaging means comprising:
  (i) event pulse divider means for dividing the frequency of said event pulses by N, where N is an integer greater than or equal to one;
  (ii) clock pulse divider means for dividing the frequency of said clock pulses by M, where M is an integer greater than or equal to one; whereby if M equals N, then the rate displayed will be averaged over N periods, and if M does not equal N then the rate displayed will be scaled by the ratio thereof;

(c) means synchronizing each event pulse to a clock pulse; and (d) overrun detector means detecting the occurrence of an event pulse when the division performed by said divider means is in progress, and means responsive thereto to indicate such overrun condition;

and wherein said means responsive to each event pulse comprises reset means for resetting said period counter means after said contents have been retained by said memory means and before the next succeeding clock pulse.

19. A ratemeter according to claim 8 wherein said divider means comprises:

parallel addition means performing the function A + B = S, the A-inputs being said contents of said period counter means retained by said memory means; and register means clocked by said clock pulses, the register inputs being the S-outputs and the register outputs being the B-inputs of said parallel addition means.

20. A ratemeter according to claim 19 further comprising means synchronizing each event pulse to a clock pulse;

and wherein said constant is loaded into said divider means during each event pulse, at least a portion of said constant being loaded through said parallel addition means by:

disabling means deactivating the outputs of said memory means during the event pulse and imposing a selected value on at least some of said A-inputs; and register reset means resetting said register outputs in response to each event pulse;

whereby the value clocked into said register means by the clock pulse coincident with the event pulse is said selected value imposed on said A-inputs by said disabling means and represents at least a portion of said constant from which said divisor is repetitively subtracted by succeeding clock pulses.

21. A ratemeter according to claim 20 wherein said divider means further comprises presettable counter means inputed from a carryout of said parallel addition means, and wherein the remainder of said constant is loaded into said presettable counters by application of said event pulse.

22. A ratemeter comprising:

clock means generating clock pulses of a known frequency;

means responsive to recurring input events to generate event pulses;

period counter means continuously incremented by said clock pulses;

divider means for dividing a divisor into a known constant by repetitively subtracting said divisor from said constant;

means responsive to each event pulse to apply the contents of said period counter means to said divider means as said divisor and reset said period counter means to a designated value, and including memory means for retaining said contents whereby incrementation to the value of said divisor is necessary only before the first subtraction in the division calculation performed by said divider means to thus provide fast response and enable said period counter means to measure every period between consecutive event pulses, each event pulse both terminating the previous period and beginning the new period; and means responsive to said divider means to provide a signal representative of the rate of recurrence of said input events as the reciprocal of the period between event pulses.

23. A ratemeter according to claim 22 further comprising shift means for setting the order of magnitude of said rate and comprising:

overflow detector means for detecting an overflow condition wherein said rate exceeds a predetermined value;

underflow detector means for detecting an underflow condition wherein said rate is less than another predetermined value; and means responsive to said overflow detector means and said underflow detector means to shift the order of magnitude of said rate and to alter the frequency of said clock pulses incremented by said period counter means.

24. A ratemeter according to claim 23 wherein said means responsive to said overflow and underflow detector means comprises bi-directional shift register means comprising:

data selector means controlled by said overflow and said underflow detector means; and register means inputed from said data selector means and clocked only in response to either an overflow or an underflow condition.

25. A ratemeter according to claim 24 wherein said means responsive to said overflow and underflow detector means further comprises:

one or more counters incremented by said clock pulses to divide the frequency of said clock pulses;

means gating the outputs of said last mentioned counters with the outputs of said register means whereby said outputs of said register means control the frequency of said clock pulses incremented by said period counter means.

26. A ratemeter according to claim 22 further comprising period averaging means comprising:

event pulse divider means for dividing the frequency of said event pulses by N, where N is an integer greater than or equal to one;

clock pulse divider means for dividing the frequency of said clock pulses by M, where M is an integer greater than or equal to one;

whereby if M equals N, then the rate will be averaged over N periods, and if M does not equal N, then the rate will be scaled by the ratio thereof.

27. A ratemeter according to claim 22 further comprising overrun detector means detecting the occurrence of an event pulse when the division performed by said divider means is in progress, and means responsive thereto to signal such overrun condition.

28. A ratemeter according to claim 22 wherein said means responsive to each event pulse comprises reset means for resetting said period counter means after said contents have been retained by said memory means and before the next succeeding clock pulse.

29. A ratemeter according to claim 22 further comprising means synchronizing each event pulse to a clock pulse.

30. A ratemeter according to claim 29 wherein said synchronizing means comprises a pair of flip-flops clocked by said clock pulses and by inversions of said clock pulses, respectively, one of said flip-flops being data inputed by said event pulses, the other of said flip-flops being data inputed by one of the outputs of said one flip-flop, and means gating said one output of said one flip-flop with the opposite type output of said other flip-flop.

31. A ratemeter according to claim 22 comprising display means responsive to said signal to display said rate.

32. A ratemeter according to claim 22 further comprising:

(a) shift means for setting the order of magnitude of said rate and comprising:

(i) overflow detector means for detecting an overflow condition wherein said rate exceeds an predetermined value;

(ii) underflow detector means for detecting an underflow condition wherein said rate is less than another predetermined value; and (iii) means responsive to said overflow detector and said underflow detector to shift the order of magnitude of the rate and to alter the frequency of said clock pulses incremented by said period counter means;

(b) period averaging means comprising:

(i) event pulse divider means for dividing the frequency of said event pulses by N, where N is an integer greater than or equal to one;

(ii) clock pulse divider means for dividing the frequency of said clock pulses by M, where M is an integer greater than or equal to one; whereby if M equals N, then the rate will be averaged over N periods, and if M does not equal N then the rate will be scaled by the ratio thereof;

(c) means synchronizing each event pulse to a clock pulse; and (d) overrun detector means detecting the occurrence of an event pulse when the division performed by said divider means is in progress, and means responsive thereto to signal such overrun condition;

and wherein said means responsive to each event pulse comprises reset means for resetting said period counter means after said contents have been retained by said memory means and before the next succeeding clock pulse.

33. A ratemeter according to claim 22 wherein said divider means comprises:

parallel addition means performing the function A + B = S, the A-inputs being said contents of said period counter means retained by said memory means; and register means clocked by said clock pulses, the register inputs being the S-outputs and the register outputs being the B-inputs of said parallel addition means.

34. A ratemeter according to claim 33 further comprising means synchronizing each event pulse to a clock pulse;

and wherein said constant is loaded into said divider means during each event pulse, at least a portion of said constant being loaded through said parallel addition means by:

disabling means deactivating the outputs of said memory means during the event pulse and imposing a selected value on at least some of said A-inputs; and register reset means resetting said register outputs in response to each event pulse;

whereby the value clocked into said register means by the clock pulse coincident with the event pulse is said selected value imposed on said A-inputs by said disabling means and represents at least a portion of said content from which said divisor is repetitively subtracted by succeeding clock pulses.

35. A ratemeter according to claim 34 wherein said divider means further comprises presettable counter means inputed from a carryout of said parallel addition means, and wherein the remainder of said content is loaded into said presettable counters by application of said event pulse.

* * * * *